United States Patent
Athikessavan et al.

(10) Patent No.: US 10,267,860 B2
(45) Date of Patent: Apr. 23, 2019

(54) FAULT DETECTION IN INDUCTION MACHINES

(71) Applicant: ROLLS-ROYCE PLC, London (GB)

(72) Inventors: Subash C Athikessavan, Singapore (SG); Sivakumar Nadarajan, Singapore (SG); Amit Kumar Gupta, Singapore (SG); Sanjib K Panda, Singapore (SG)

(73) Assignee: ROLLS-ROYCE plc, London (GB)

( * ) Notice: Subject to any disclaimer, the term of this patent is extended or adjusted under 35 U.S.C. 154(b) by 349 days.

(21) Appl. No.: 14/626,026

(22) Filed: Feb. 19, 2015

(65) Prior Publication Data

US 2015/0260794 A1  Sep. 17, 2015

(30) Foreign Application Priority Data

Mar. 11, 2014 (GB) .................................. 1404226.1

(51) Int. Cl.
| | |
|---|---|
| *G01R 31/00* | (2006.01) |
| *G01R 19/165* | (2006.01) |
| *G01R 31/34* | (2006.01) |
| *G01R 31/02* | (2006.01) |
| *G01R 31/06* | (2006.01) |

(52) U.S. Cl.
CPC ......... *G01R 31/343* (2013.01); *G01R 31/025* (2013.01); *G01R 31/06* (2013.01)

(58) Field of Classification Search
CPC ..... G01R 31/343; G01R 31/025; G01R 31/06
USPC ..................................................... 702/58, 75
See application file for complete search history.

(56) References Cited

U.S. PATENT DOCUMENTS

| | | | | |
|---|---|---|---|---|
| 4,011,512 A | * | 3/1977 | Drury .................... | H04B 17/17 455/109 |
| 4,085,355 A | * | 4/1978 | Fradella .................. | H02P 23/06 318/703 |
| 4,330,753 A | * | 5/1982 | Davy ....................... | H03K 9/02 327/545 |
| 4,761,703 A | | 8/1988 | Kliman et al. | |

(Continued)

FOREIGN PATENT DOCUMENTS

EP    2 113 780 A1    11/2009

OTHER PUBLICATIONS

Bruzzese et al., "Rotor Bars Breakage in Railway Traction Squirrel Cage Induction Motors and Diagnosis by MCSA Technique Part I: Accuracte Fault Simulations and Spectral Analyses," International Symposium on Diagnositics for Electric Machines, 2005.

(Continued)

*Primary Examiner* — Ly D Pham
(74) *Attorney, Agent, or Firm* — Oliff PLC

(57) ABSTRACT

A method of detecting a fault in an induction machine having one or more windings arranged to draw current at a supply frequency, the method including: performing a process of judging whether a respective sideband of one or more selected harmonics of the supply frequency exists at a predetermined fault frequency in a signal in the one or more windings; and determining that a fault has occurred if the judgement is positive; wherein in the judging process each of the selected harmonics of the supply frequency is a harmonic frequency of the supply frequency other than the supply frequency itself.

17 Claims, 16 Drawing Sheets

(56) References Cited

U.S. PATENT DOCUMENTS

| | | | | |
|---|---|---|---|---|
| 5,049,815 A | | 9/1991 | Kliman | |
| 5,469,009 A | * | 11/1995 | Wakui | H02K 1/265 310/179 |
| 5,512,843 A | | 4/1996 | Haynes | |
| 5,519,300 A | * | 5/1996 | Leon | G01R 31/343 318/729 |
| 5,519,337 A | | 5/1996 | Casada | |
| 5,521,482 A | * | 5/1996 | Lang | G01R 31/343 318/800 |
| 5,530,343 A | * | 6/1996 | Bowers, III | G01P 3/48 324/160 |
| 5,729,421 A | * | 3/1998 | Gershen | G01R 19/0053 324/520 |
| 5,742,522 A | * | 4/1998 | Yazici | G05B 9/02 324/545 |
| 5,875,420 A | * | 2/1999 | Piety | G01M 13/028 340/683 |
| 6,201,391 B1 | * | 3/2001 | Burkhardt | G01N 27/82 324/233 |
| 6,308,140 B1 | * | 10/2001 | Dowling | G01R 31/343 324/765.01 |
| 6,711,694 B1 | * | 3/2004 | Svensson | H04B 15/04 713/500 |
| 6,798,210 B2 | | 9/2004 | Goodrich | G01R 31/343 324/262 |
| RE38,822 E | * | 10/2005 | Aarts | H04R 3/00 381/61 |
| 7,469,190 B2 | * | 12/2008 | Bickel | G01D 4/002 700/293 |
| 8,405,339 B2 | | 3/2013 | Zhang et al. | |
| 2003/0209077 A1 | * | 11/2003 | Battenberg | G01P 3/36 73/587 |
| 2004/0199348 A1 | * | 10/2004 | Hitchcock | G01M 13/028 702/92 |
| 2009/0091289 A1 | * | 4/2009 | Nandi | H02P 29/0241 318/700 |
| 2009/0292505 A1 | * | 11/2009 | Van Dyke | G01H 1/00 702/184 |
| 2010/0169030 A1 | * | 7/2010 | Parlos | G01H 1/00 702/58 |
| 2010/0301792 A1 | | 12/2010 | Tiwari et al. | |
| 2011/0080197 A1 | * | 4/2011 | Fan | G01R 19/02 327/156 |
| 2011/0234181 A1 | * | 9/2011 | Hobelsberger | H02P 29/00 322/99 |
| 2011/0290024 A1 | * | 12/2011 | Lefler | G01H 1/003 73/579 |
| 2013/0338939 A1 | * | 12/2013 | Nandi | G01R 31/346 702/38 |
| 2015/0233792 A1 | * | 8/2015 | Gao | G01M 99/005 702/35 |

OTHER PUBLICATIONS

Choi et al., "Fault Diagnosis Technique of Induction Machines with Ordered Harmonic and Noise Cancellation," IEMDC, 2009, pp. 1333-1339.
Sahraoui et al., "An Improved Algorithm for Detection of Rotor Faults in Squirrel Cage Induction Motors BAsed on a New Fault Indicator," ICEM, 2012, pp. 1572-1578.
Salem et al., "Induction Motor Fault Diagnosis Using an Improved Combination of Hilbert and Park Transforms," MELECON, 2012, pp. 1141-1146.
Sep. 15, 2014 Search Report issued in United Kingdom Application No. GB 1404226.1.
Jul. 8, 2015 Search Report issued in European Patent Application No. 15 15 5695.
Oct. 4, 2018 Office Action issued in European Patent Application No. 15 155 695.8.

* cited by examiner

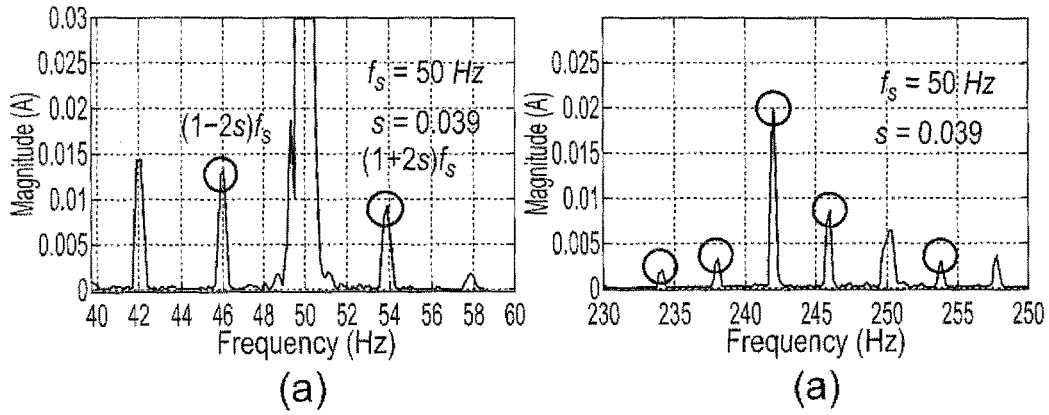
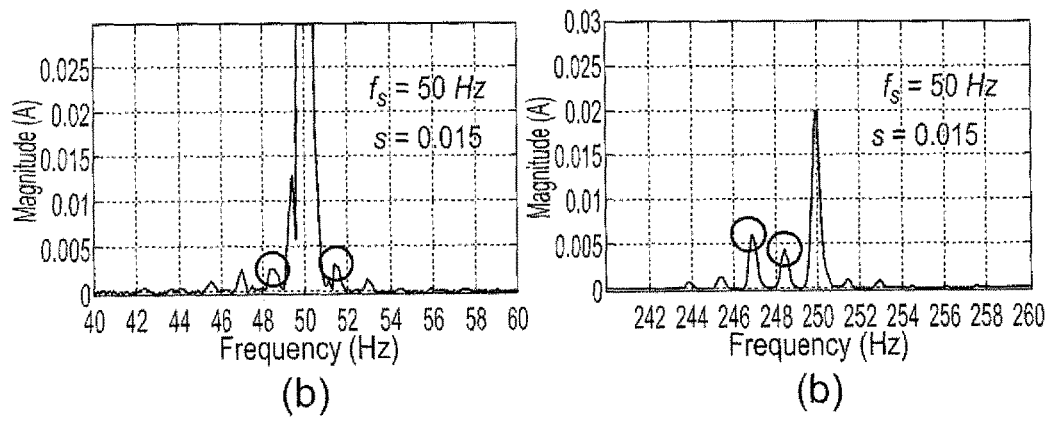
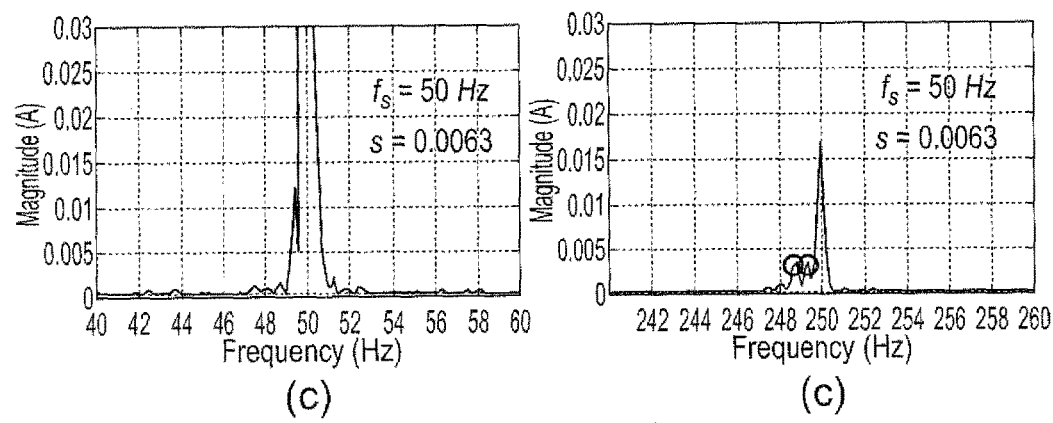
FIG. 5          FIG. 6

FAULT DETECTION IN INDUCTION MACHINES

FIELD OF THE INVENTION

The present invention relates to detecting faults in induction machines: in particular, but not exclusively, to the detection of broken rotor bar (BRB) faults in induction machines, such as induction motors.

BACKGROUND OF THE INVENTION

Electrical machines are widely used in industrial applications. More than 80% of rotating machines worldwide are induction machines, and they are responsible for consuming around 50% of the total power generated in industrialized nations.

Induction machines are also used in safety and mission critical applications such as actuators in aircraft and propulsion motors in marine vessels.

It is therefore important to improve the reliability, and hence availability for function, of induction machines, e.g. motors, by early and reliable detection of faults. Electrical stress and thermal stress are the primary reasons for faults in induction machines. If these faults are undetected at early stages then these faults can lead to electrical or mechanical failure, which can cause permanent damage to the machine, and potential excessive loss of revenue.

The Broken Rotor Bar (BRB) fault is one of the predominant failure modes of induction machines, e.g. motors. The consequences of this fault include excessive vibrations, poor starting performances, torque fluctuation, and high thermal stress. If this fault remains undetected it may lead to potentially catastrophic failures. Thus, it is important to detect this particular fault to prevent permanent failure of induction machine.

The prior art discusses ways to detect this particular fault. In general, a typical methodology for detecting this fault is motor current signature analysis (MCSA). This method utilizes the machine stator current frequency signatures to detect the BRB fault. Under normal operation of a three phase induction motor, the three phase flux generates forward rotating magnetic field which rotates at synchronous speed with the rotor. A rotor fault such as a BRB fault introduces asymmetry in the machine current, which produces a backward rotating field, rotating at a slip frequency of the machine.

The interaction of this backward field with the stator windings induces an EMF at a frequency of $(1-2s)f_s$, where $f_s$ is the supply frequency (or fundamental line frequency), and s is the slip of the machine. Because of cyclic current variation, the rotor speed oscillation induces upper sidebands of frequencies $(1+2s)f_s$. Hence the frequency of the BRB spectral components in the stator current can be expressed as, $$f_{brb} = (1 \pm 2ks)f_s \quad (1)$$

Where, $f_{brb}$ is the BRB frequency, $f_s$ is the supply frequency, s is the slip and k=1, 2, 3, 4 . . . which denotes the index of the sidebands around the supply frequency $f_s$.

In general, a sideband of any selected frequency is a pair of frequency components, respectively being higher and lower in frequency than the selected frequency by the same difference (in frequency). As per equation (1), the frequency component of interest is the fundamental, or supply, frequency ($f_s$). The fundamental frequency is the supply frequency of the input current/voltage to the motor.

This classical method for detecting BRB faults is based on identifying and extracting the twice slip frequency sidebands around the fundamental (or base) supply frequency (also known as the fundamental line frequency), as represented by equation (1). For illustration purposes, FIG. 1 and FIG. 2 respectively show the line current frequency spectrum of a healthy induction machine (e.g. a motor) and an induction machine experiencing a BRB fault. The sidebands of the fundamental supply frequency as circled in FIG. 2 are characteristic of a BRB fault.

Alternatively to using the classical equation above, the prior art suggests other ways to detect faults in induction machines, in particular way to detect BRB faults.

For example, US20100301792 discloses a method for detecting an anomaly in an induction machine, and discloses two different embodiments. In the first embodiment, the instantaneous impedance is used to detect a BRB fault, the instantaneous impedance is calculated from the sequential voltages and currents. The instantaneous impedance under healthy and BRB fault are shown in FIG. 9 and FIG. 10 respectively in US20100301792. As shown therein in FIG. 10, the low frequency modulation in impedance is used to diagnose the BRB fault.

In a second embodiment, a volt-ampere method is proposed to reduce the computational burden of division by introducing multiplicative approach for coherent modulation and for the pronounced effect of fault signature. The transformation is utilized to compute the instantaneous alpha and beta component of the voltages and currents. Using these voltage and current components four different instantaneous volt-amperes are calculated by combining different combination of currents and voltages. The low frequency component in the instantaneous of power is the signature of a BRB fault as shown in FIG. 12B of US20100301792. The flow chart summarizing the approach is shown in FIG. 25 of US20100301792.

Another alternative prior art disclosure is provided in EP2113780B1. This prior art discloses a method for detecting damage caused to the short-circuit rings and/or bars of asynchronous motors. According to the disclosure, broken bars produce a significant alteration in the length spanned by each pole over the air gap of the machine and said alteration constitutes the parameter that is used as fault detection. The variations in the length of the magnetic poles are detected by measuring the flux linkage at one of the stator teeth using an auxiliary winding/search coil which is disposed in said stator tooth. The measured magnetic flux linkage is used to determine the value of EMF induced in the auxiliary coil situated around stator tooth, and then the period of EMF is determined by calculating time between the successive zero crossing. The period of EMF is compared with the period corresponding to the power supply frequency (f) of the motor, and interpreting as an indicator of damaged rotor bars and/or short-circuit rings if the period of EMF does not coincide with period corresponding to supply frequency (f).

Another prior art disclosure is provided by US8405339B2, in which is proposed a system and method for detecting a rotor fault condition in an AC induction machine which includes BRB faults and bearing faults. The system includes a processor programmed to receive voltage and current data from an AC induction machine, to generate a current frequency spectrum from the current data, and to identify rotor-fault related harmonics in the current frequency spectrum. The processor is also programmed to calculate a fault severity indicator using the voltage and current data, identify fault related harmonics, and motor specifications. The processor then generates an alert based on the possibility of rotor fault.

Yet another prior art disclosure is provided by U.S. Pat. No. 5,049,815, in which is disclosed a method for detecting rotor faults in an induction motor by analysis of a frequency spectrum of the current drawn by the motor under test. A method and apparatus is disclosed for detecting rotor faults in induction motors which relies solely on passive monitoring and analysis of the motor current. Signals indicative of the current drawn by the motor are digitized, stored, and digitally processed using a Fast Fourier Transform (FFT) to generate a frequency spectrum of the motor current. According to the disclosure, when rotor faults exist, signal peaks should appear in the motor current at frequencies calculated according to the following equation:

$$f_k = f_0\left(\frac{k}{p}(1-s) \pm s\right) \text{ [prior art equation] } f_k = f_0\left(\frac{k}{p}(1-s) \pm s\right)$$

Where, $f_k$ is the broken rotor bar fault frequency, p is the motor pole-pairs, $f_0$ is the supply frequency (also referred to as the fundamental line frequency), s is the per unit slip of the motor or slip frequency/$f_0$ and k=1, 2, 3, etc. According to the disclosure, the fundamental motor current frequency is identified and, based on an estimation of the motor slip frequency (typically obtained from the motor nameplate data), a search is conducted for current peaks in excess of an established threshold in a sideband of the fundamental frequency over a search range predicated on the slip frequency estimate. If no current peaks are found, the rotor is declared to be fault-free. However, if current peaks are noted in the fundamental frequency sideband(s), then the frequency of each is declared a slip frequency candidate, and checks are conducted in appropriate harmonic sidebands, at frequencies predicted on the basis of each slip frequency candidate, for matching current peaks. According to the disclosure only certain harmonics are investigated—in particular, only those harmonics at k/p=1, 5, 7, 11, 13 etc. As long as matching current peaks are noted, the slip frequency candidates remain qualified. The search is extended to higher harmonic sidebands until all but one of the slip frequency candidates are disqualified. The one remaining candidate is then declared the slip frequency of the motor and is utilized in a rotor fault analysis of the motor current spectrum to determine the nature and severity of the fault.

However, these prior art methods have significant disadvantages. For example they:

a. Require high frequency resolution of current signals

The frequency of the BRB fault signature (which is a function of slip) is close to the fundamental supply frequency, which makes it difficult to detect unless the frequency spectrum of the measured current has a high resolution. The high frequency resolution requires more data points, hence it is computationally intensive and may slow down the decision making process. In particular, U.S. Pat. No. 5,049,815 discloses to begin the process of identifying a rotor bar fault on the basis of a search conducted for current peaks in excess of an established threshold in a sideband of the fundamental frequency, and to declare that the rotor is fault free if no current peaks are found. Thus, U.S. Pat. No. 5,049,815 requires very high resolution data processing.

b. Require high slip to detect fault

The detection of twice slip frequency under no load condition is not possible in the cited prior art since the current in the rotor bar is negligible. Hence, the prior art typically overloads the machine to increase the currents in the rotor bars to detect the fault (for example, the slip is increased to 35% more than the full load slip). Increase in slip for constant load can also be achieved by reducing the input voltage to the motor which in turn will reduce the torque generated and thereby reduce the rotor speed. Hence the slip of the motor can be increased even under no load conditions.

c. Are unable to detect low severity/incipient fault

The magnitude of the BRB fault frequency components under low severity condition are relatively small compared with the magnitude of the fundamental supply frequency, which will eventually lead to elimination of the components as noise by fault detection and diagnosis system. Again, U.S. Pat. No. 5,049,815 discloses to begin the process of identifying a rotor bar fault on the basis of a search conducted for current peaks in excess of an established threshold in a sideband of the fundamental frequency, and to declare that the rotor is fault free if no current peaks are found. Therefore, there is a significant risk when following the teaching of U.S. Pat. No. 5,049,815 that a genuine fault may not be reliably identified.

SUMMARY OF THE INVENTION

The present invention aims to provide a method and apparatus which reliably provides an indication of a fault in an induction machine, in particular a BRB fault in e.g. a motor.

In an aspect, the present invention provides a method of detecting a fault in an induction machine having one or more windings arranged to draw current at a supply frequency (the fundamental line frequency), the method comprising: performing a process of judging whether a respective sideband (or sidebands) of one or more selected harmonics of the supply frequency exists at a predetermined fault frequency in (the frequency spectrum of) a signal in the one or more windings (e.g. in one or more phase components of the supply current); and determining that a fault has occurred if the judgement is positive; wherein in the judging process: each of the selected harmonics is at a harmonic frequency of the supply frequency other than the supply frequency (itself).

Accordingly, the present invention provides a reliable fault detection method at low frequency resolution of the current frequency spectrum, at low slip, and at low fault severity.

The method may include a step of assessing whether the magnitude of the sideband exceeds a predetermined threshold, and determining that a fault has occurred if the assessment is positive.

The method may include modifying the signal to include the one or more selected harmonics as one or more respective probe harmonics. Thus, where the supply current to the induction machine is clean and does not inherently include harmonic frequencies of the (fundamental) supply frequency (at appreciable amplitudes), useful probe harmonic frequencies can be added to the signal so that the fault frequency components can be detected in the event that a fault occurs.

The process of judging may comprise performing a determination, assessment, calculation, computation or analysis. Thus it may be a process of determining, a process of assessing, a process of calculating, a process of computing or a process of analysing.

The judgement step may include the step of judging whether a sideband (or sidebands) of at least one of the one or more probe harmonics exists at the predetermined fault frequency in the signal in one or more windings of the induction machine. For example, judging whether a sideband (or sidebands) of at least one of the one or more probe harmonics exists at the predetermined fault frequency in the one or more phase components of the current drawn by the induction machine.

The judgement step may only include the step of judging whether a sideband (or sidebands) of at least one of the one or more probe harmonics exists at the predetermined fault frequency in a signal in one or more windings of the induction machine. Thus, the method may be performed more quickly than the prior art techniques.

The method preferably includes the step of generating or identifying the predetermined fault frequency ($f_{brb}$) on the basis of the following equation:

$$f_{brb} = (f_h \pm 2ksf_s), \text{ Where } k=1, 2, 3, \ldots$$

where, $f_s$ is the supply frequency, $f_h$ is the frequency corresponding to the $h^{th}$ order harmonic of the supply frequency, and s is the slip of the induction machine. h is preferably greater than 1, where 1 defines the fundamental line frequency (the supply frequency). In other words, the supply frequency $f_s$ can be though as being related to $f_h$ as follows:

$$f_h(h=1) = f_s$$

The equation provided by the present invention is principally based on the sidebands around harmonics. The lobe width for the (non-fundamental) harmonics are smaller than the lobe width of the fundamental harmonic (i.e. the supply frequency), for the same given frequency resolution. Thus, even when using a low resolution frequency spectrum for the (stator) current, the fault signatures can be identified more reliably according to the present invention than the prior art; i.e. the sidebands can reliably be distinguished from the respective harmonic and thus can be readily identified. (This advantage can be seen from the frequency signatures calculated at s=0.039 using classical and proposed equation as will be discussed below).

Unlike the existing approach which looks for only (−2s) components of 1, 5, 7, 11, 13 . . . harmonic order, as discussed in e.g. U.S. Pat. No. 5,049,815, the equation proposed by the present inventors generates both (+2s) and (−2s) components. The proposed methodology has the flexibility in selection of harmonic order and the number of sidebands as given by the (non-exhaustive) table below for example.

TABLE 1

| | Frequency components generated by the new equation proposed herein | | |
|---|---|---|---|
| $f_h$ | $f_{brb}$ (k = 1, p = 1) First sidebands (±2s) | $f_{brb}$ (k = 2, p = 1) Second sidebands (±4s) | $f_{brb}$ (k = 3, p = 1) Third sidebands (±6s) |
| $f_0$ | $f_0(1 − 2s)$, $f_0(1 + 2s)$ | $f_0(1 − 4s)$, $f_0(1 + 4s)$ | $f_0(1 − 6s)$, $f_0(1 + 6s)$ |
| $2f_0$ | $f_0(2 − 2s)$, $f_0(2 + 2s)$ | $f_0(2 − 4s)$, $f_0(2 + 4s)$ | $f_0(2 − 6s)$, $f_0(2 + 6s)$ |
| $3f_0$ | $f_0(3 − 2s)$, $f_0(3 + 2s)$ | $f_0(3 − 4s)$, $f_0(3 + 4s)$ | $f_0(3 − 6s)$, $f_0(3 + 6s)$ |

Thus, the present invention provides the ability to detect both positive and negative side bands (+2s and −2s frequency components). In other words, the equation provided by the present invention checks for both positive and negative sidebands around the harmonics, which in turn increases the reliability of fault detection. It also provides flexibility in the selection of the harmonic order and number of sidebands around the selected harmonic order.

The method may include the step of measuring the signal, for example to obtain signal measurement information. The method may include the step of acquiring the frequency spectrum of the signal in order to perform the judgement step. For example, the method may include the step of generating the frequency spectrum on the basis of the obtained signal measurement information. The frequency spectrum may be generated on the basis of a Fourier Transform technique, for example a fast Fourier Transform. The method may include the step of calculating the slip of the induction machine on the basis of the acquired or generated frequency spectrum.

Preferably, the induction machine includes a stator. Preferably, the one or more windings are provided by the stator. For example, the current drawn by the induction machine, e.g. by the stator, may be single or poly phase. Preferably, the one or more windings (i.e. the one or more current phase components) are arranged to drive the rotation of a rotor when supplied with a driving voltage (and thus drawing the current) at the supply frequency.

The induction machine is preferably an induction motor, but the present invention is also application to an induction generator. The present method is capable of detecting a fault in a rotor bar of the motor, e.g. a non-function rotor bar or a rotor bar functioning sub-optimally.

The signal is preferably a time varying current flowing in the respective winding. The current may be a component phase current of the total current drawn by the stator of the induction machine. For example, the total current supplied to the induction machine may be supplied via respective phase component currents, each phase component current being supplied at the supply frequency but at a phase which is respectively different to the other phase components. For example, the induction machine may be supplied with a three phase current, e.g. by a three phase current or power supply.

The predetermined fault frequency may be a function of the slip of the induction machine. The slip may be calculated on the basis of acquired values for the speed and supply frequency.

The induction machine may be a generator, and the fault may be in a damper bar of the generator. The generator may be a synchronous generator. The generator may be a brushless generator. The generator may be a brushless synchronous generator.

The induction machine may be a sub-assembly of a synchronous generator having a rotor. The induction machine may include a stator. The sub-assembly may be arranged to be capable of accelerating the rotation of the rotor relative to the stator; and/or is arranged to help maintain the speed of rotation of the rotor at the desired speed; and wherein the fault is a fault in a damper bar of the sub-assembly. The method is capable of detecting a fault in a damper bar of the sub-assembly, e.g. a non-functioning damper bar or a damper bar functioning sub-optimally.

The one or more windings are preferably arranged to draw current at the supply frequency to drive rotation of the rotor, e.g. of the motor or the generator.

Preferably, the signal in the one or more windings is at least a component of said current. Thus, the method may include the step of measuring the current drawn by the one or more windings.

The present invention also preferably allows BRB faults to be distinguished from air gap eccentricity. The equation proposed by the present inventors for broken rotor bar fault detection can also be used to detect static and dynamic eccentricity faults (static and dynamic) in e.g. a motor. In air gap eccentricity fault detection, the rise in the magnitude of the first sideband around the harmonics, for example harmonics other than the fundamental harmonic e.g. other than the fundamental line frequency, is detected and a fault can be determined.

As the new equation is used to identify both broken rotor bar and air gap eccentricity, the power distribution of one or more harmonics to the respective adjacent sideband(s) are calculated to eliminate ambiguity, and distinguish between BRB faults and air gap eccentricity.

The power distribution can be calculated as follows, $$h^{th} \text{ harmonic power distribution} = \frac{f_h}{\sum_{i=1}^{n} \sqrt{fsb_i}}$$

Where, h is the nth order harmonic, and i is the sideband number and n is the sideband number limit. The number of sidebands which appear across the harmonics depends on the slip of the machine. However, only few sidebands will have significant magnitude, which can be used for fault detection. Hence n can be limited to the number of sidebands that can be selected for further processing.

Accordingly, the present invention also provides the ability to detect air gap eccentricity, and the present invention preferably provides the ability to differentiate between air gap eccentricity and broken rotor bar faults. For example, the methods disclosed herein can be used to identify the air gap eccentricity from broken rotor bar faults using the power distribution of harmonics to the respective sideband(s), because the present inventors have realised that the power distribution of the (e.g. non-fundamental) harmonics to the respective sideband(s) for broken rotor bar faults is low when compared with that of the air gap eccentricity.

Accordingly, a method according to the present invention may include the step of determining whether the power distribution of at least one of the one or more selected harmonics to its sidebands is below a predetermined threshold; and determining the fault type based on the determination.

Power distribution of a harmonic is the distribution of power of the harmonic to its sidebands. It does so by losing its power to its sidebands.

The fault type may be a broken rotor bar fault when the power distribution is below the threshold. The fault type may be an air gap eccentricity when the power distribution is above the threshold.

In another aspect, the present invention provides a fault detector for detecting a fault in an induction machine having one or more windings arranged to draw current at a supply frequency, the fault detector comprising: a sensor for acquiring a measurement of a signal in the one or more windings (e.g. a measurement of a phase component of the current drawn by the machine), and for transmitting an output indicative of the frequency spectrum of the measured signal; a processor arranged to receive the transmitted output, and arranged: to perform a process of judging, on the basis of the received output whether a respective sideband of one or more selected harmonics of the supply frequency exists at a predetermined fault frequency in the measured signal in the one or more windings of the induction machine; and to determine that a fault has occurred if the judgement is positive; wherein when performing the judging process each of the selected harmonics is a harmonic frequency of the supply frequency other than the supply frequency itself.

A signal modifier may be arranged to modify the signal to include the one or more selected harmonics as one or more probe harmonics.

The processor may be arranged to judge whether a sideband of at least one of the one or more probe harmonics exists at the predetermined fault frequency in the measured signal.

The processor may be arranged to generate the predetermined fault frequency ($f_{brb}$) on the basis of the following equation:

$$f_{brb} = (f_h \pm 2ksf_s), \text{ Where } k=1, 2, 3, \ldots$$

where, $f_s$ is the supply frequency, $f_h$ is the frequency corresponding to the $h^{th}$ order harmonic of the supply frequency, and s is the slip of the induction machine.

The processor may be arranged to generate, on the basis of the received output of the sensor, the frequency spectrum of the measured signal in order to perform the judgement step.

The processor may be further arranged to determine whether the power distribution of at least one of the one or more selected harmonics to its sidebands is below a predetermined threshold; and determining that a fault has occurred if the determination is positive.

The processor may be arranged to calculate the slip of the induction machine on the basis of the generated frequency spectrum.

The induction machine may be an induction motor, and the fault may be in a rotor bar/bars of the motor. The induction machine may be a generator, and the fault is in a damper bar/bars of the generator.

The one or more windings may be arranged to draw the current at the supply frequency to drive rotation of a rotor.

The signal may be at least a phase component of said drawn current.

In another aspect the present invention provides a method of detecting a fault in an induction machine supplied with current at a supply frequency, the method comprising: performing a process of judging whether a respective sideband of one or more selected harmonics of the supply frequency exists at a predetermined fault frequency in a signal in one or more windings of the induction machine (e.g. in a phase component of the current drawn by the induction machine); and determining that a fault has occurred if the judgement is positive;
wherein the predetermined fault frequencies are calculated according to the following equation:

$$f_{brb} = (f_h \pm 2ksf_s), \text{ Where } k=1, 2, 3, \ldots$$

where, $f_s$ is the supply frequency, $f_h$ is the frequency corresponding to the $h^{th}$ order harmonic of the supply frequency, and s is the slip of the induction machine. In essence, it is determined whether or not the frequency spectrum of the signal contains peaks at one or more fault frequencies calculated on the basis of said equation.

In another aspect, the present invention provides a fault detector for detecting a fault in an induction machine arranged to draw current at a supply frequency, the fault detector comprising: a sensor for acquiring a measurement of a signal in one or more windings of the induction machine (e.g. a phase component of the current drawn by the induction machine), and for transmitting an output indicative of the frequency spectrum of the measured signal; a processor arranged to receive the transmitted output, and arranged: to perform a process of judging, on the basis of the received output whether a respective sideband of one or more selected harmonics of the supply frequency exists at a predetermined fault frequency in the measured signal in the one or more windings of the induction machine; and to determine that a fault has occurred if the judgement is positive; wherein the processor is arranged to calculate the predetermined fault frequencies according to the following equation:

$$f_{brb} = (f_h \pm 2ksf_s), \text{ Where } k=1, 2, 3, \ldots$$

where, $f_s$ is the supply frequency, $f_h$ is the frequency corresponding to the $h^{th}$ order harmonic of the supply frequency, and s is the slip of the induction machine.

It is to be noted that any feature of any embodiment, example or aspect, can be introduced into any other embodiment, example or aspect, where it is technically possible to do so, unless that introduction is explicitly said to be undesirable.

BRIEF DESCRIPTION OF THE DRAWINGS

Embodiments of the invention will now be described by way of example with reference to the accompanying drawings in which:

FIGS. 5(a) to (c) shows frequency spectra for the supply current for a motor experiencing a BRB fault at various slip coefficients, s=0.039, s=0.015 and s=0.0063, centred on the fundamental supply frequency of the motor (50 Hz).

FIGS. 6(a) to (c) shows frequency spectra for the supply current for a motor experiencing a BRB fault at various slip coefficients, s=0.039, s=0.015 and s=0.0063, centred on the $5^{th}$ order harmonic of the fundamental supply frequency of the motor (250 Hz).

DETAILED DESCRIPTION AND FURTHER OPTIONAL FEATURES OF THE INVENTION

In an aspect, the present invention provides a new equation to detect faults, e.g. BRB faults, in electrical machines such as induction motors. The new equation identifies the sideband frequencies which are characteristic fault frequency components of a BRB fault. But, unlike the prior art classical equation (equation (1) above) used in existing techniques, the new equation helps to identify the fault frequency components (the sidebands) of harmonics of the fundamental supply frequency, other than the fundamental supply frequency itself.

The present invention provides several advantages over the prior art, such as reliable fault detection at low frequency resolution of current frequency spectrum, low slip (e.g. low load), and at low fault severity. Furthermore, the present invention is applicable to single phase current measurements (in addition to multi-phase current measurements), which has the added advantage of requiring less computational resource, and means the invention is easy to integrate into induction machines, e.g. by retrofitting a suitable sensor or sensors (if necessary) and by providing suitable software.

The present invention will now be explained by way of example with reference to a three phase induction machine, e.g. a motor. Under normal operating conditions the speed of the rotating magnetic field produced by the rotor bars is given by, $$(N_s - N_r) = sN_s \quad (2)$$

Where $N_s$ is the synchronous speed or speed of rotating field produced by stator three phase quantities, $N_r$ is the rotor speed and s is the slip of the motor.

When a fault occurs, in particular a BRB fault, the air gap permeance varies which results in asymmetries in the magnetic field of the induction machine. The asymmetry in the magnetic field produces backward rotating magnetic fields which in turn induce harmonic components in the stator winding currents. These induced harmonic components are fault frequency components, typically characteristic of a BRB fault. The fault frequency components are used by the present invention as fault indicators to detect and diagnose BRB faults.

Figure 3:
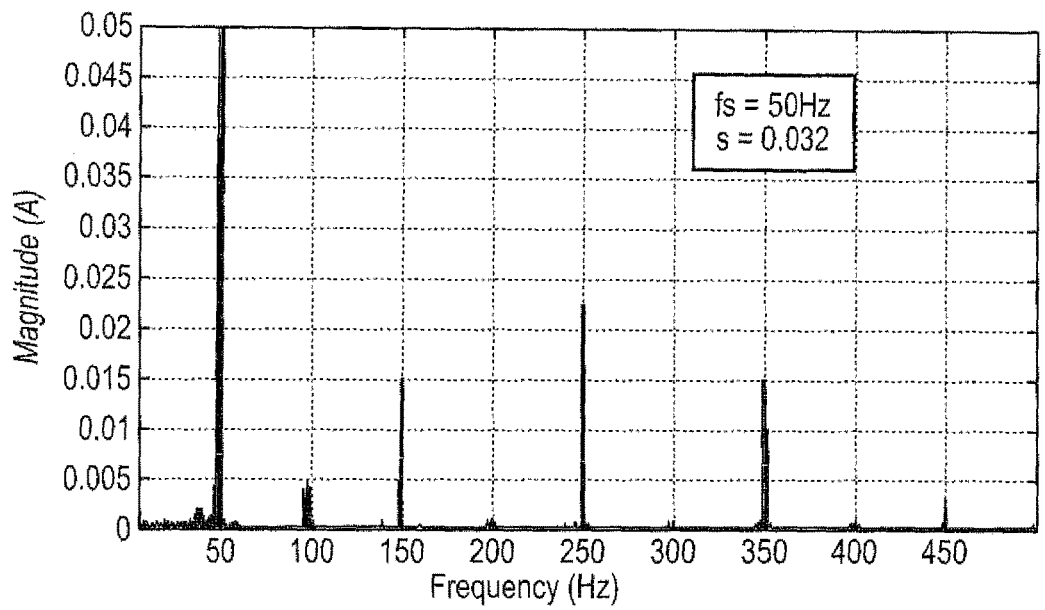
FIG. 3 shows a frequency spectrum for the supply current for a healthy motor.
Figure 4:
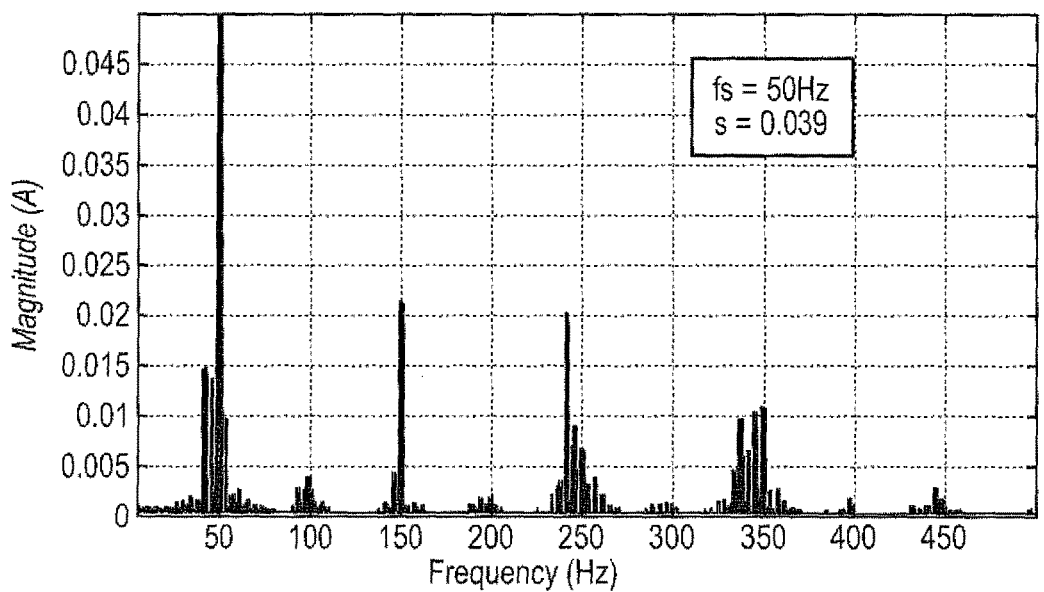
FIG. 4 shows a frequency spectrum for the supply current for a motor experiencing a fault, e.g. a BRB fault.

The fault frequency components can be seen, by comparing FIGS. 3 and 4. The fundamental supply frequency (fundamental line frequency) of the motor is shown as ~50 Hz in both figures.

FIG. 3 shows a frequency spectrum of an induction machine stator current which is operating normally, i.e. without a fault such as a BRB fault.

FIG. 4 shows a frequency spectrum of an induction machine stator current in an induction machine which is operating with a fault, in particular a BRB fault. As can be seen, the frequency harmonics of the supply frequency of the faulty machine include identifiable additional harmonic components on each side of the respective frequency harmonic.

The prior art techniques focus on the harmonic components induced in the stator current due to the interaction between the backward rotating field (produced by BRB) and the fundamental supply frequency of the stator current. In other words, with reference to FIG. 3 and FIG. 4, the prior art focuses on the harmonic component associated with the 50 Hz supply frequency.

However, the present invention proposes to detect faults based on the induced harmonic components in the stator current due to the interaction between the backward rotating field and the harmonic components in the stator current other than the fundamental harmonic (for example the 3rd, 5th, 7th, 9th . . . etc harmonic components). The present invention takes advantage of the fact that the characteristic frequency components of a BRB fault appear as sidebands around the (non-fundamental) harmonic frequencies of the stator current, as shown in FIG. 4 at e.g. frequencies 100, 150, 200 and 250 Hz. These harmonics will be referred to as the non-fundamental harmonics, whereas the harmonic at 50 Hz will be referred to as the fundamental harmonic (the fundamental harmonic being the harmonic at the supply frequency, also referred to as the fundamental frequency or fundamental line frequency).

The derivation for obtaining a generalized characteristic equation to obtain the expected frequencies of the sidebands around the non-fundamental harmonics of stator current induced by a BRB fault is given below.

The backward rotating field produced by the BRB with respect to the rotor is given by, $$-sN_s \qquad (3)$$

The backward rotating field in (3) is obtained by considering that only the fundamental components in stator current/voltage is responsible for rotor current. The speed of backward rotating field in (3) with respect to the stator is given by, $$N_{brb}=(N_r-sN_s) \qquad (4)$$

Where $N_{brb}$ is the speed of the rotating magnetic field produced by a BRB fault referred to the stator.

The slip due to the fundamental frequency $f_s$ is given by, $$s = \frac{N_s - N_r}{N_s} \qquad (5)$$

$$N_{brb} = N_s - sN_s - sN_s \qquad (6)$$

The effect of stator current harmonic components on the backward rotating field produced by BRB is very small, so the effect of stator harmonic components on backward rotating field in (3) and (4) are typically neglected and only the fundamental components of stator current are considered to get the backward rotating field.

The backward rotating field produced by a BRB fault influences the stator current, and hence induces sidebands in the stator current.

Figure 1:
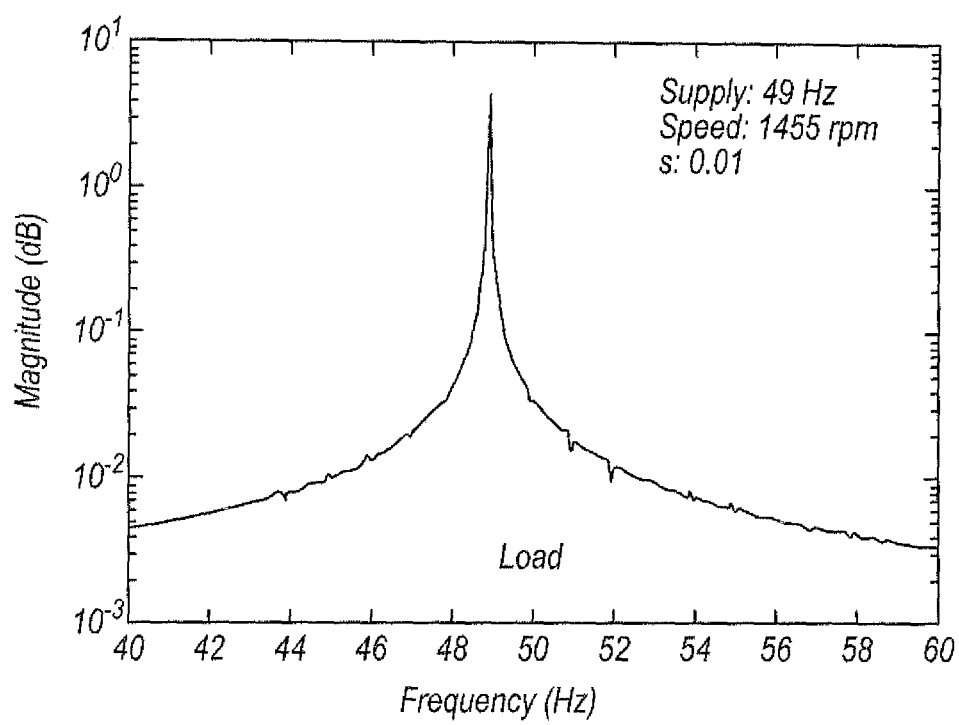
FIG. 1 shows an example of the frequency spectrum of the motor current in a fault free motor, obtained e.g. by a fast Fourier transform of the measured motor current.
Figure 2:
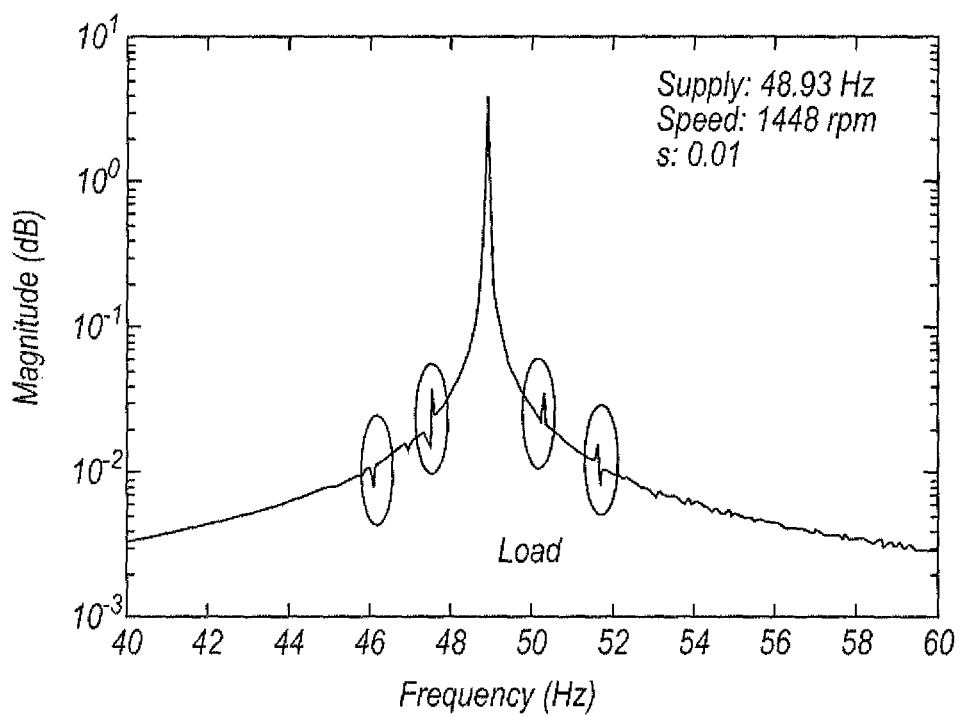
FIG. 2 shows an example of the frequency spectrum of the motor current in a motor experiencing a fault such as a broken rotor bar, obtained e.g. by a fast Fourier transform of the measured motor current.

As mentioned earlier, the prior art focuses on the influence of the backward rotating field on the fundamental supply frequency of the current as shown in FIG. 2. In other words the classical characteristic equation for a BRB fault is used in the prior art techniques. The classical characteristic equation is a function of only the fundamental supply frequency.

However, according to the present invention, the influence of the backward rotating field produced by a BRB fault containing additional non-fundamental harmonics in the stator current is considered. As per the present invention, the rotor speed due to fundamental component ($-sN_s$) is dominant and the rotor continues to generate backward rotating field at speed of $-2sN_s$ irrespective of the non-fundamental harmonics present in the system. The influence of rotating backward rotating field, $-2sN_s$ generated by the rotor on the non-fundamental harmonics in the stator current can be estimated by adding the harmonic speed $N_h$ to $-2sN_s$. Where $N_h$ is the speed of the $h^{th}$ harmonic component. Considering $N_h$ and including the effect of forward magnetic field will give $N_{brb}$ as given below, $$N_{brb}=(N_h \pm 2sN_s) \qquad (7)$$

The frequency representation of the new characteristic equation and classical characteristic equation for a BRB fault can then be represented as follows New characteristic equation for e.g. BRB faults, according to the present invention:

$$f_{brb}=(f_h \pm 2ksf_s), \text{ Where } k=1, 2, 3, \ldots \qquad (8)$$

Classical characteristic equation for e.g. BRB faults, according to the prior art:

$$f_{brb}=(1 \pm 2ks)f_s, \text{ Where } k=1, 2, 3, \ldots \qquad (9)$$

Where, $f_s$ is supply frequency (fundamental supply frequency) of current, $f_h$ is the frequency corresponding to the $h^{th}$ order harmonic of the supply frequency.

The parameter k is an integer value which denotes the number of side bands for any selected harmonic frequency ($f_h$), e.g. first sideband frequencies, second sideband frequencies, third sideband frequencies and so on.

From equation (8), by putting the value of the non-fundamental harmonic components ($f_h=2f_s, 3f_s, \ldots$) which are present in the frequency spectrum of the stator current, it can be inferred that the sidebands which are characteristics of a fault, e.g. a BRB fault, can be extracted and identified.

The new characteristic equation (8) has been validated in an experimental setup by comparing results with the classical BRB equation (9) under various operating conditions, the results of which are shown in FIGS. 5 and 6.

FIG. 5 (*a*) and FIG. 6(*a*) are views of the stator current FFT under full load slip (s=0.039) at the fundamental supply frequency (50 Hz) and at the 5$^{th}$ harmonic of the supply frequency (250 Hz) respectively, for an induction machine suffering a BRB.

It is evident from FIG. 5(*a*) that under full load slip the classically predicted fault frequency components (sidebands) may be identifiable. However, the sidebands around the 5$^{th}$ order harmonic shown in FIG. 6(*a*) are significantly larger (with respect to the 5$^{th}$ order harmonic peak at 250 Hz) and thus should be more easily detectable than the sidebands around the fundamental harmonic at 50 Hz which is at least an order of magnitude larger than its associated sidebands, as shown in FIG. 5(*a*).

Furthermore, it is clear from FIG. 6(*b*) and FIG. 6(*c*) which show the sidebands around the 5th harmonic frequency at half load slip (s=0.015) and no load slip (s=0.0063) that the sidebands resulting from a BRB fault around the non-fundamental harmonics are significant even under no load condition. On the other hand, the sidebands around the fundamental harmonic frequency as shown in FIG. 5(*b*) and FIG. 5(*c*), are not so easily identifiable.

Thus, BRB fault detection using sidebands around non-fundamental harmonics is preferable to achieve a wider range of operating conditions than BRB fault detection using sidebands around the fundamental harmonic frequency.

This will be explored in more detail. FIG. 5 shows the frequency spectrum centred on the fundamental supply frequency (i.e. the supply frequency of the induction machine). Where they can be identified, some of the fault frequency components (sidebands) are circled for reference. The circled fault frequency components in FIG. 5 can be predicted based on the classical equation (9) above. The values for the slip and the supply frequency (the fundamental supply frequency) required for the prediction are given on the respective plots.

FIG. 5(*a*), for example, shows circled sidebands at 46.1 Hz and 53.9 Hz, which are predicted by the classical equation when a fault occurs, where the supply frequency ($f_s$) is 50 Hz, and where the slip of the machine s=0.039.

FIG. 5(*b*) shows circled sidebands at 48.5 Hz and 51.5 Hz, which are also predicted by the classical equation when a fault occurs, where the supply frequency ($f_s$) is 50 Hz, and where the slip of the machine s=0.015.

FIG. 5(*c*) does not show any circled sidebands. The classical equation predicts that sidebands should be seen at 49.37 Hz and at 50.63 Hz. However, in practice, these sidebands cannot be extracted from the frequency spectrum, because the main peak at the supply frequency (the fundamental supply frequency) is too wide and dominates them. So, in the prior art fault detection techniques that rely on the classical equation, the fault resulting in the plot of FIG. 5(*c*) and a slip of s=0.0063 will not be detected.

However, as can be seen by referring to FIG. 6 (*c*), the fault frequency components associated with e.g. the $5^{th}$ harmonic frequency at 250 Hz are detectable even at a slip value of s=0.0063. They are circled in FIG. 6(*c*). Thus, the new characteristic equation can be used to identify whether or not the fault frequency components are present, and thus whether the induction machine is experiencing a fault, e.g. a BRB fault, under operating conditions that mean the classical equation would not permit the detection of the fault.

For example, for a slip of s=0.0063 and a supply frequency ($f_s$) of 50 Hz, new characteristic equation (8) above yields for k=1 and k=2 the circled sideband frequencies of 249.37 Hz and 248.74 Hz. Thus, when it is identified that sideband peaks exist at one or more of these frequencies, for example, it can be determined that BRB fault has occurred.

Indeed, it can also be seen by comparing FIG. 6(*b*) with FIG. 5(*b*) that it is likely to be easier, and thus more reliable, to identify the presence of the fault frequency components associated with a non-fundamental harmonic, for example the $5^{th}$ harmonic as shown in FIG. 6(*b*), than the fault frequency components associated with the fundamental supply frequency, as shown in FIG. 5(*b*).

For the avoidance of doubt, the new characteristic equation can be applied to any non-fundamental harmonic components in the stator current, not only the $5^{th}$ order harmonic shown here.

For example, it can be seen from FIG. 4 that the fault frequency components appear equally prominently around the other non-fundamental harmonics too.

Table 2 below lists the characteristic frequencies for a BRB fault obtained via the classical equation and the new characteristic equation, the obtained fault frequency components are highlighted by being circled, where it is possible to do so, in FIG. 5 and FIG. 6.

TABLE 2

| Load | Slip | Classical characteristic equation $f_{brb} = (1 \pm 2ks)f_s$ $f_s = 50$ Hz, k = 1 | New characteristic equation $f_{brb} = (f_h \pm 2ksf_s)$, $f_h = 250$ Hz, k = 1, 2, 3 |
|---|---|---|---|
| No load | 0.0063 | 49.4 and 50.6 (not possible to circle in FIG. 5) | 248.1, 248.7, 249.4 |
| Half load | 0.0153 | 48.5 and 51.5 | 245.4, 246.9, 248.5 |
| Full load | 0.039 | 46.1 and 53.9 | 234.4, 238.3, 242.2, 246.1, 253.9 |

Thus, in an aspect, the new characteristic equation is able to identify the fault signatures (fault frequency components) around the non-fundamental harmonics to facilitate fault detection across a wider range of operating conditions than the prior art.

The identified fault signatures present a significant magnitude (peak signal amplitude) relative to the non-fundamental harmonic frequency itself, even under no load conditions. This contrasts favourably with the BRB fault detection techniques employing the classical equation above, which typically do not permit detection of a BRB fault under certain operating conditions, e.g. no load conditions. In FIG. 5(*a*), for example, the magnitude of the sideband around the fundamental frequency is 1% (at 46 Hz) of the fundamental frequency magnitude which is very small because of the low severity of fault (in the example, only 4 broken bars are provided in the rotor). The sideband may therefore be difficult to detect when the severity of the fault is relatively low. Nevertheless low severity faults, and incipient faults, can quickly become catastrophic faults and it is therefore important to be able to detect them.

Furthermore, the sidebands corresponding to a BRB fault are slip dependent and so fault detection at low load conditions is difficult in the prior art. The prior art techniques also typically require high frequency resolution to effectively separate the sidebands from fundamental components. Often, only if the slip is increased significantly by increasing loading of the machine, or by the fault being very severe (for example by there being an increased number of broken bars), will the sideband around the fundamental supply frequency increase significantly in magnitude to become more readily detectable. Hence, in the prior art detection techniques, a BRB fault is only readily detectable when the fault severity is high or the load on the machine is high.

According to the present invention, however, the magnitudes of the fault frequency components (sidebands) around the non-fundamental harmonics are relatively large compared with the magnitude of the (associated) non-fundamental harmonic frequency itself. For example, it can be seen from FIG. 6 (*c*) that even at an effective no load condition (e.g. s=0.0063) the magnitude of the fault frequency components are still of the order of 25% of the magnitude of the signal at the $5^{th}$ order harmonic (250 Hz). This makes the detection of the fault frequency components easier to achieve with the present invention than with the prior art.

Detailed Examples

Figure 7:
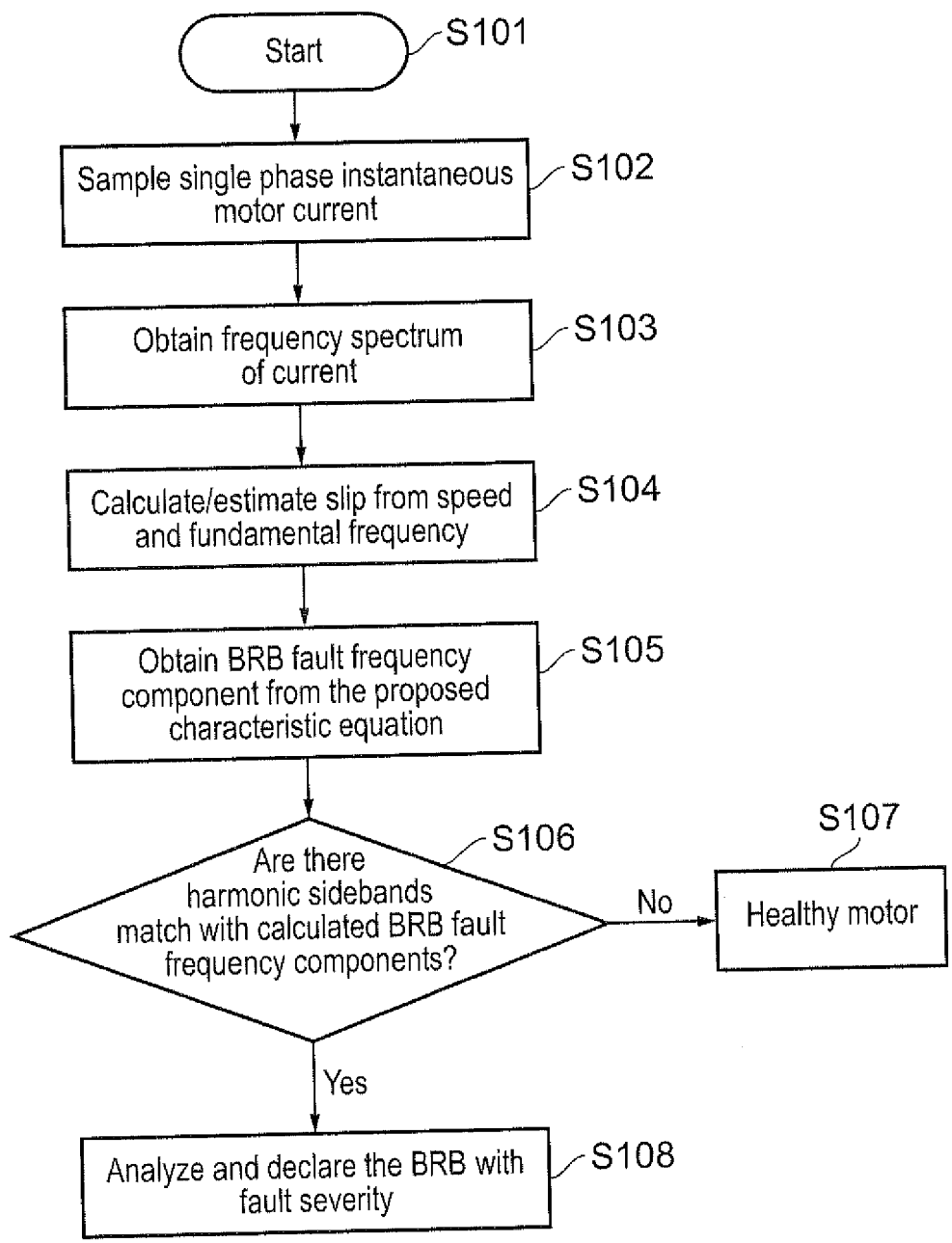
FIG. 7 shows a first example process embodying the present invention.

A first example process embodying the present invention is shown in FIG. 7.

A process to detect a fault in an induction machine, for example an induction motor is described. The process starts at S101.

At S102, information indicative of the current in the motor is acquired.

For example, information about the instantaneous current in the motor may be acquired. For example, information about the current in one or more windings of the motor may be acquired. The one or more windings are typically located on the stator.

The stator may include a plurality of windings for driving the rotor. Each winding may be arranged to conduct a respective phase component of a driving current provided to the stator windings to drive rotation of the rotor.

For example, the stator may provide a plurality of windings each arranged to conduct a respective phase component of a multiphase (poly-phase) driving current. The driving current may be three phase, for example.

The step of acquiring the information indicative of the current in the motor may include the step of acquiring a current measurement result, for example of the single phase of the driving current. It may include the step of measuring the current, for example the single phase of the driving current. It may include the step of sampling the current, for example the single phase of the driving current.

In S103 the frequency spectrum of the current is obtained, for example generated. A fast Fourier transform (FFT) may be performed on the current measured in the one or more windings to obtain the frequency spectrum. Other techniques and transformations could be used to obtain the frequency spectrum.

The fundamental supply frequency of the current in the one or more windings may be determined. The fundamental supply frequency is typically the frequency of the current flowing in the one or more windings for driving the motor, e.g. the stator winding(s). The current in the windings may be mutually offset relative to one another by a phase difference, e.g. a regular phase difference.

In S104, the slip of the induction machine is calculated (or estimated) based on the rotational speed of the machine (for example a measured value for the rotational speed of the machine, in particular the rotational speed of the rotor of the machine relative to the stator of the machine) and on the fundamental frequency, for example obtained from the result of S103.

In S105, predicted fault frequency components for one or more non-fundamental harmonics of the fundamental frequency are obtained. For example, equation (8) above is used to generate the predicted fault frequency components for the one or more non-fundamental harmonics of the fundamental supply frequency obtained in S103.

In S106, a judgement is made as to whether the frequency spectrum obtained at S103 contains any sidebands (spectral components) around the non-fundamental harmonics which match, or coincide, with the fault frequency components obtained in S105.

If the judgement in S106 is negative, then the process moves to S107 in which it is determined that the motor is healthy, or fault free. In particular, it can be determined at S107 that the motor is not experiencing a broken rotor bar (BRB) fault.

However, if the judgement in S106 is positive, then process moves to S108, in which it is determined that the motor is experiencing a fault. The fault may be determined to be a BRB fault, for example.

In S106, an analysis of the fault may optionally be performed to determine the type of fault and/or the severity of the fault.

Figure 8:
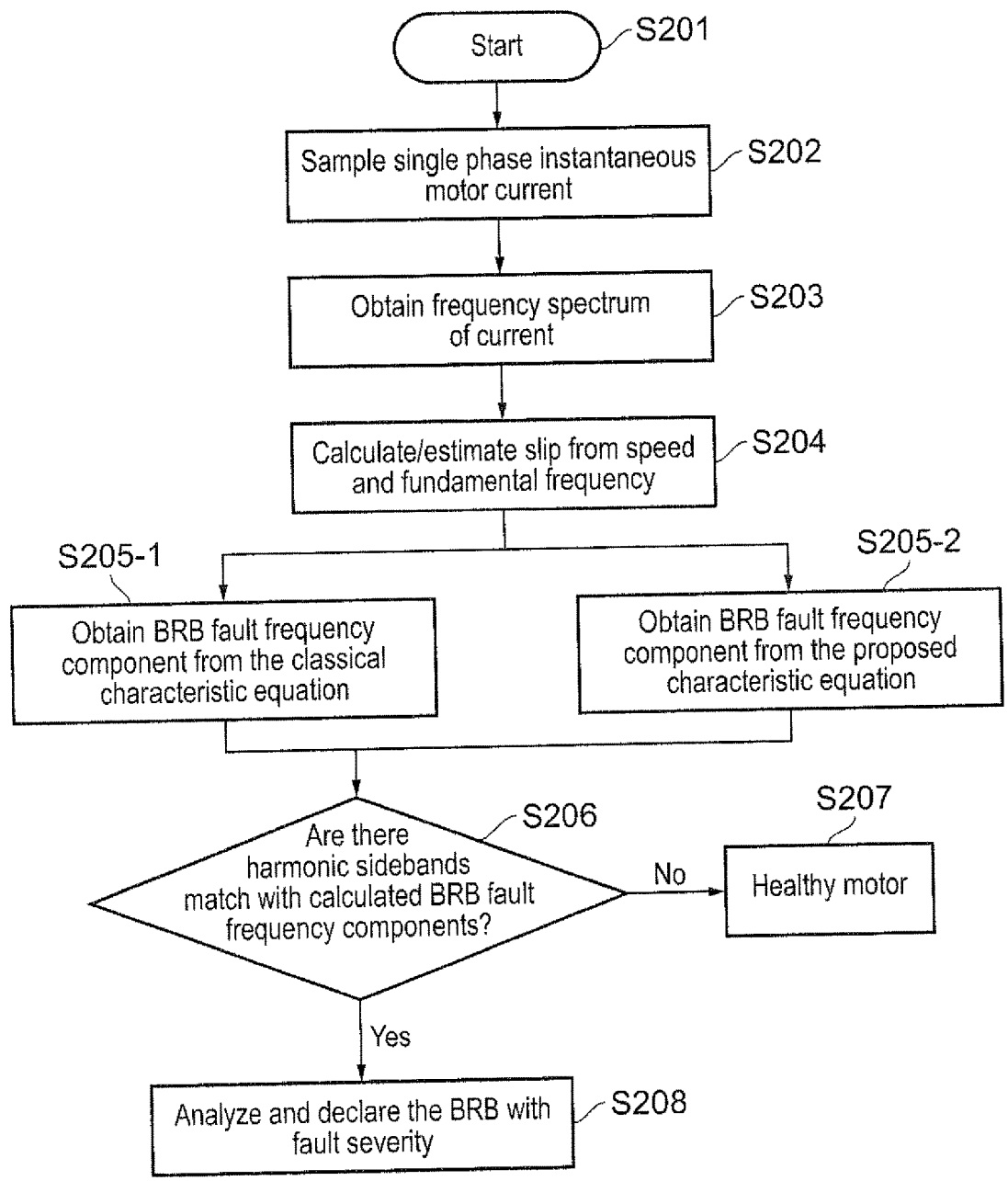
FIG. 8 shows a second example process embodying the present invention.

A second example process embodying the present invention is shown in FIG. 8. In FIG. 8 steps S201 to S204 and S206 to S208 are similar to S101 to S104 and S106 to S108 in the first example. Furthermore, this second example may include any optional feature disclosed herein.

However, steps S205-1 and S205-2 may be performed substantially in parallel, such that in this example not only is the new characteristic equation (equation (8) above) used to generate predicted fault frequency components associated with non-fundamental harmonics (of the motor current) in S205-2, but the classical equation (equation (9) above) is also used to generate predicted fault frequency components associated with the fundamental supply frequency in S205-1.

Step S206 may therefore additionally, or alternatively, make a judgement about whether or not the frequency spectrum obtained at S203 shows the fundamental supply frequency to exhibit fault frequency components as predicted in S205-2.

Thus, both the classical and new characteristic equations can be used together, in conjunction, to detect a fault in the induction machine, such as a BRB fault. This approach may be useful for electrical machines used in non-mission-critical non-safety-critical applications where the detection/diagnosis process can be allowed to take more time for data acquisition and decision making. Nevertheless, although this approach may be slower than other processes disclosed herein, it may have improve the reliability of fault detection.

Figure 9:
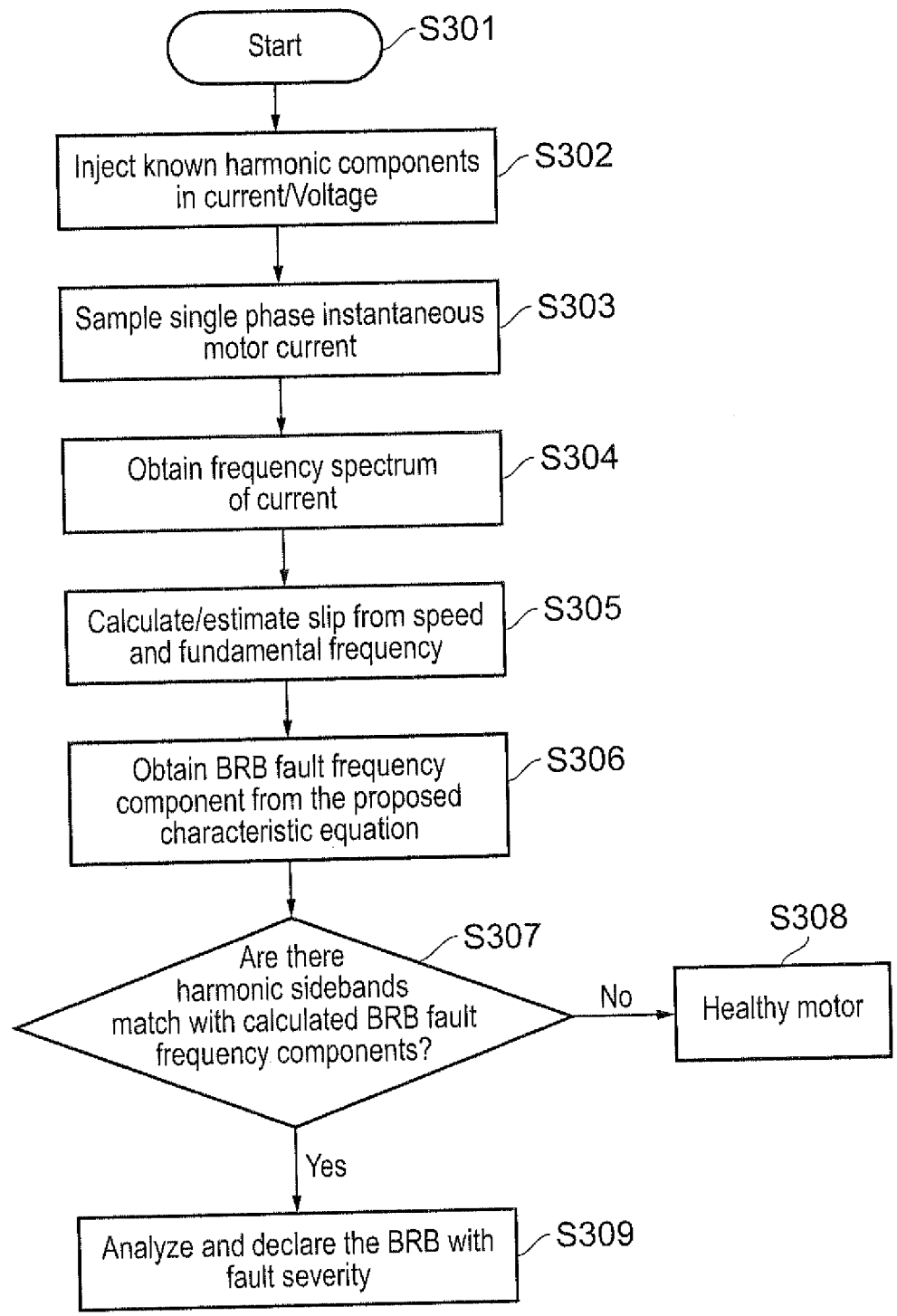
FIG. 9 shows a third example process embodying the present invention.

A third example process embodying the present invention is shown in FIG. 9.

This third example process is configurable to be similar to the first and second examples, and may include any optional feature disclosed herein. Thus, for example S306 could optionally be executed similarly to S205-1 and S205-2, if desired; and the steps other than S302 could be executed similarly to the equivalent steps in the first and/or second example.

However, this third example process includes step S302. This third example process is useful when the motor current, e.g. the stator current, is inherently very clean and does not inherently contain any appreciable non-fundamental harmonics, such as the $3^{rd}$, $5^{th}$, $7^{th}$, . . . etc. order harmonics.

Thus, to take advantage of the present invention, one or more non-fundamental harmonics can be injected (superimposed) in to the motor, e.g. stator winding, signal(s) or current(s). The interaction of the injected current harmonics, with the backward rotating magnetic field produced as a consequence of a fault, will yield the fault frequency components (in the presence of a fault). Thus, the sidebands generated around the injected non-fundamental harmonic(s) can be analysed to detect a fault such as a BRB fault.

For example, in S302, the motor drive current is modified to include one or more non-fundamental harmonics, referred to as one or more probe harmonics. This may be achieved by the application of a suitable current or voltage source to one or more of the stator windings, for example.

In step S304, in which the frequency spectrum of the current in the one or more stator windings is obtained, it might be expected that the one or more probe harmonics will be a prominent feature of the spectrum. The magnitude (amplitude) of the one or more probe harmonics may be controlled accordingly.

In S306, it may only be necessary to obtain fault frequency components for the (one or more) probe harmonic(s), because it is known that the probe harmonic(s) are present in the signal at a suitable magnitude and/or because it is known that non-fundamental harmonics other than the probe harmonics are not present in the signal. Thus, only a relatively small set of predicted fault frequency components may need to be generated at S306. In other words, this third process allows for a focussed probing and analysis of the state of operation of the induction machine. Accordingly, S306 may be executed more quickly than other processes, because a smaller set of fault frequency components need be generated.

At S307, therefore, it may only be necessary to make a judgement about whether the frequency spectrum obtained at S304 contains any sidebands around the probe harmonics which match, or coincide, with the predicted fault frequency components obtained in S306.

Therefore, this third example fault detection process may be suitably quicker, not only with respect to the prior art but even with respect to some other embodiments of the present invention.

In a fourth example embodying the present invention, at least two, and preferably all, of the respective phases of a multiphase (poly-phase) motor current may be analysed to look for fault frequency components associated with the non-fundamental harmonics. This may be useful where diagnosis of a detected fault is desirable, as useful information about the fault(s) may be derivable by comparing and contrasting the fault frequency components identified in the respective phase current. This example will be explained with reference to FIG. 10, which shows a process which begins at S401.

In S402, information about at least two, but preferably all, of the phase current components of the total (driving) multiphase current in the stator windings (arranged to cause rotation of the rotor) are acquired. For example, the instantaneous current of at least two, but preferably all, of the phase current components is acquired, e.g. measured.

For example, where the stator is supplied with a three phase current for driving the rotation of the rotor, information about all three phase currents is preferably acquired.

In S403 a frequency spectrum for the at least two currents is obtained. The frequency spectrum may represent each current. However, a respective frequency spectrum may be obtained for each current.

In S406, a judgement is made as to whether the or each frequency spectrum obtained at S403 contains any sidebands around the non-fundamental harmonics which match, or coincide, with the fault frequency components obtained in S405.

If the judgement in S406 is negative then the process moves to S407, and a determination that the induction machine is healthy, e.g. fault free, may be made.

Alternatively, if the judgement in S406 is positive, then it can be determined that a fault has occurred in the induction machine, and a list of the identified fault frequencies may be generated for, e.g. each phase current, so as to allow more in depth analysis and diagnosis of the fault to be performed in S409.

In S409, on the basis of the generated information, a declaration of the type and/or severity of the fault may be made.

S405 may be executed in a similar way to S205-1 and S205-2 above.

A step equivalent to S302 above may also be included in this example, or indeed any other example. For example, one or more of the respective phase currents may be modified to include one or more probe harmonics, and S405 may be executed to obtain only the predicted fault frequencies for the one or more probe harmonics. Consequently, S406 it may only be necessary to obtain fault frequency components for the (one or more) probe harmonic(s), because it is known that the probe harmonic(s) are present in the signal at a suitable magnitude.

In aspects, the present invention also provides a means to detect air gap eccentricity. Indeed, in aspects, the present invention also provides a means to distinguish BRB faults from air gap eccentricity.

Figure 11A:
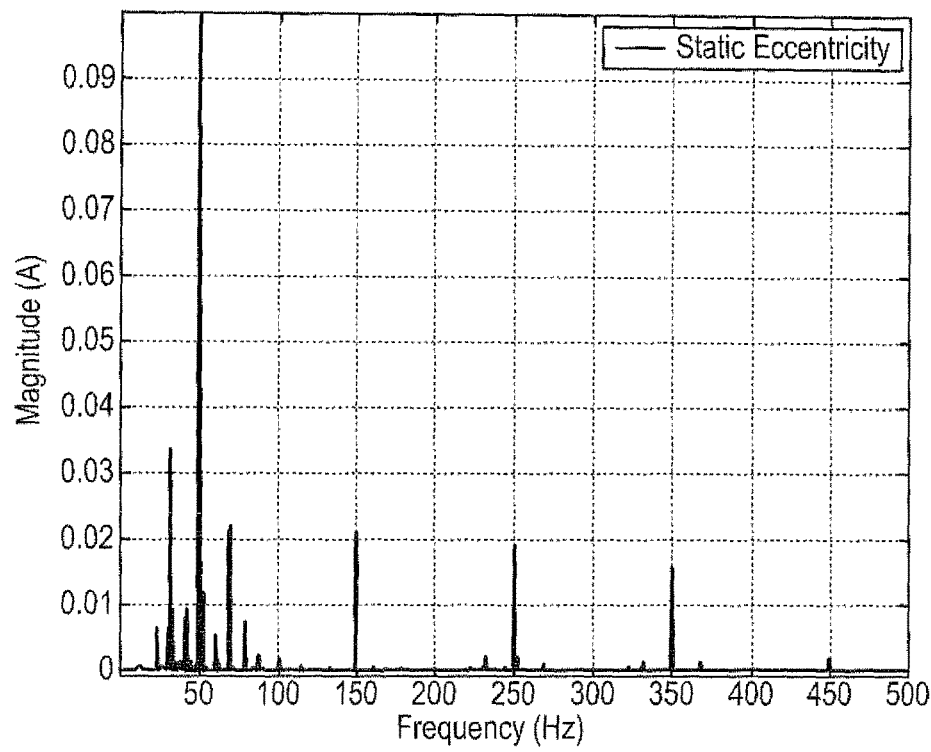
FIG. 11A shows the frequency spectrum of an induction machine stator current for static air-gap eccentricity fault with shaft speed oscillations.
Figure 11B:
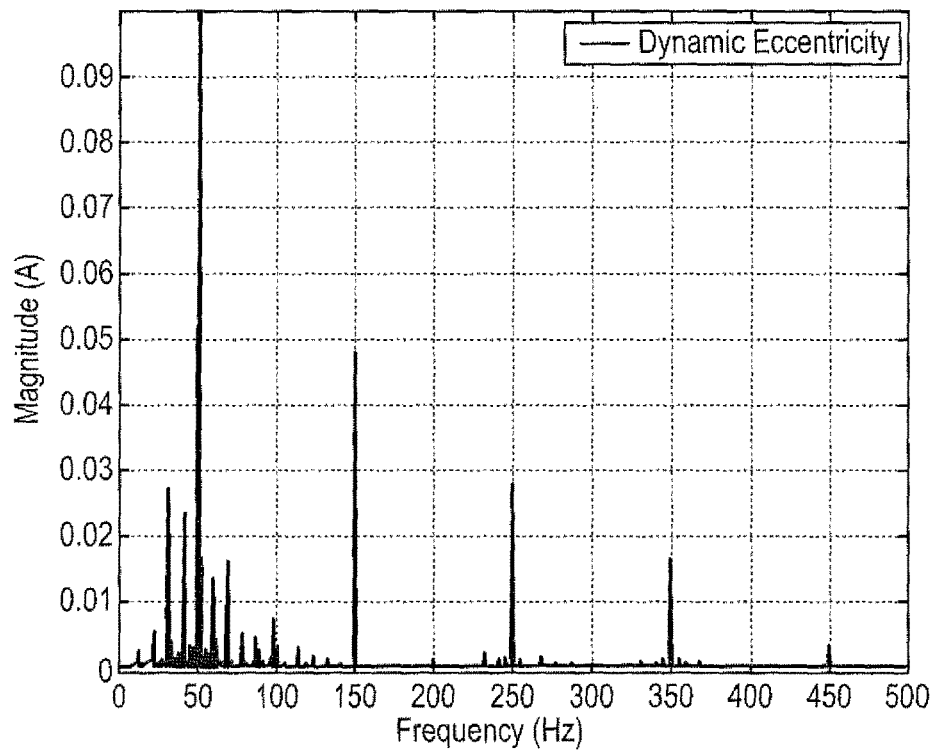
FIG. 11B shows the frequency spectrum of an induction machine stator current for dynamic air-gap eccentricity.

FIG. 11A shows the frequency spectrum for the motor stator current for a motor which is experiencing static eccentricity. For comparison, the frequency spectrum for the motor stator current for a motor which is experiencing dynamic eccentricity is shown in FIG. 11B. As can be seen there are appreciable sidebands around the non-fundamental frequency (i.e. the fundamental harmonic, at 150 Hz, 250 Hz, 350 Hz, . . . etc).

Figure 12:
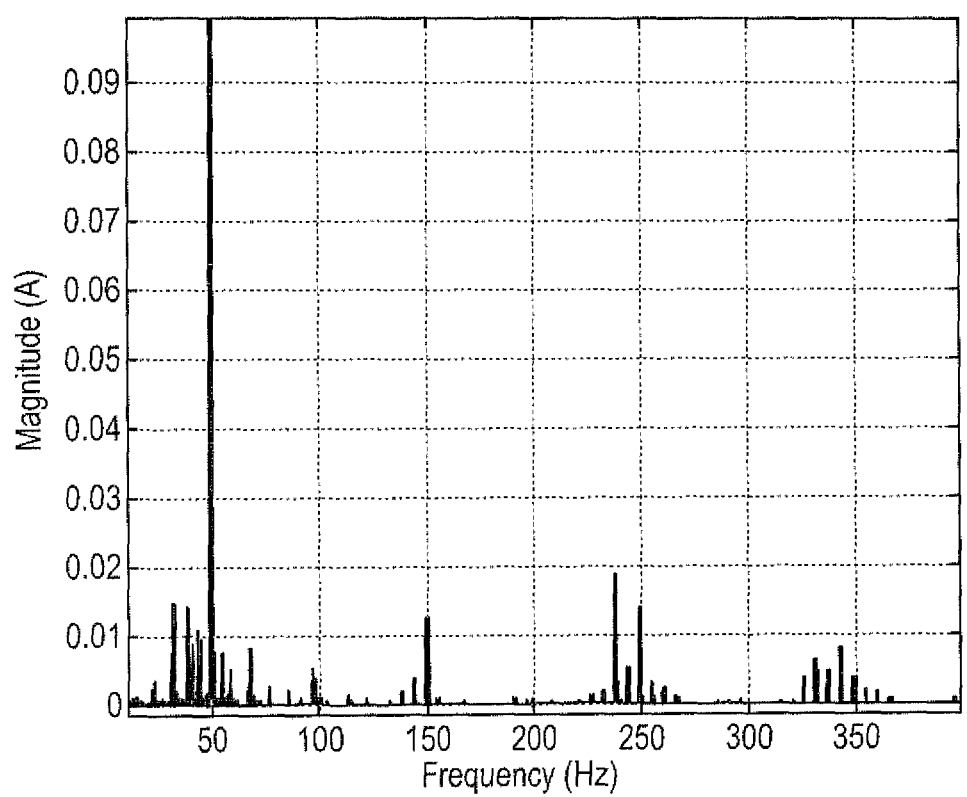
FIG. 12 shows the frequency spectrum of an induction machine stator current, where the machine is experiencing a broken rotor bar fault, with shaft speed oscillation.

FIG. 12 shows the frequency spectrum for the motor stator current for a motor experiencing a BRB fault. The present inventors have realised that the differences between the frequency spectrum for the stator current in an induction machine experiencing air gap eccentricity and in an induction machine experiencing a BRB fault can optionally be used to ensure that air gap eccentricity is not mistaken for a BRB fault, and/or vice versa.

Therefore, in aspects, the present invention includes an optional process of analysing the power distribution of a harmonic relative to the sidebands of the respective harmonic. In general, if the power distribution is low (for example, lower than a threshold value, for example a predetermined threshold value) a determination may be made that a BRB fault has occurred.

Figure 13:
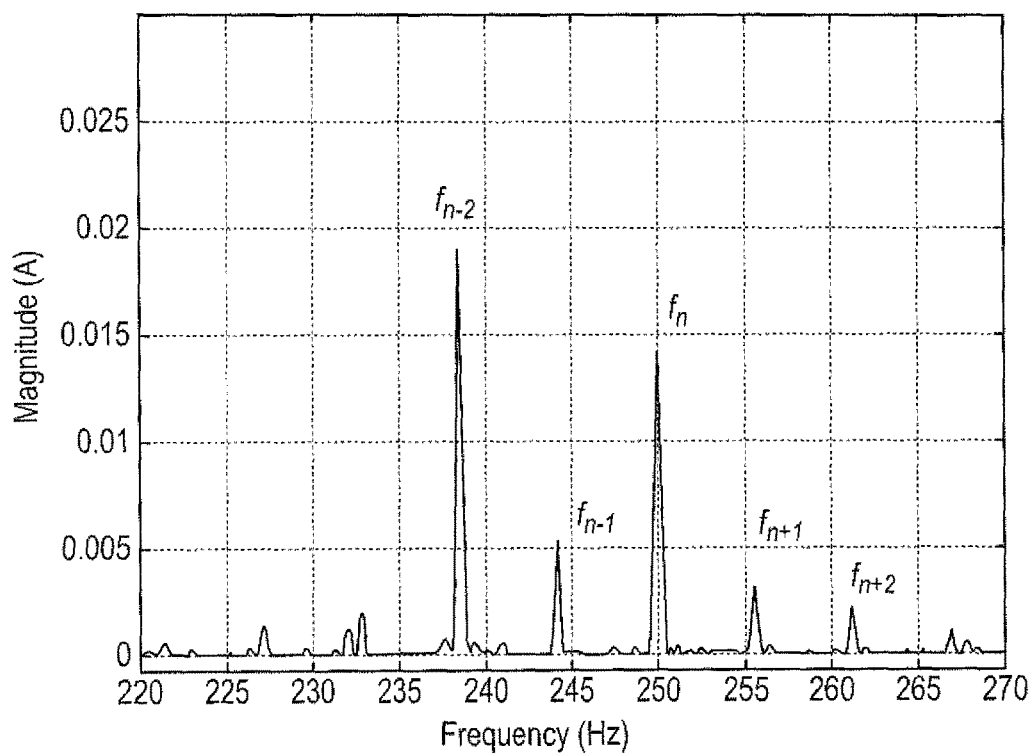
FIG. 13 shows the power distribution of the sideband peaks around a harmonic peak at $f_n$=250 Hz.

For example, FIG. 13 shows an example of the power distribution of a harmonic, the fifth order harmonic (250 Hz relative to 50 Hz) in the example shown, to its sidebands. As can be seen the power distribution of the harmonic relative to its sidebands is low. In particular, it is lower than the corresponding power distribution shown in FIGS. 11A and 11B for the same harmonic order at 250 Hz.

Figure 14:
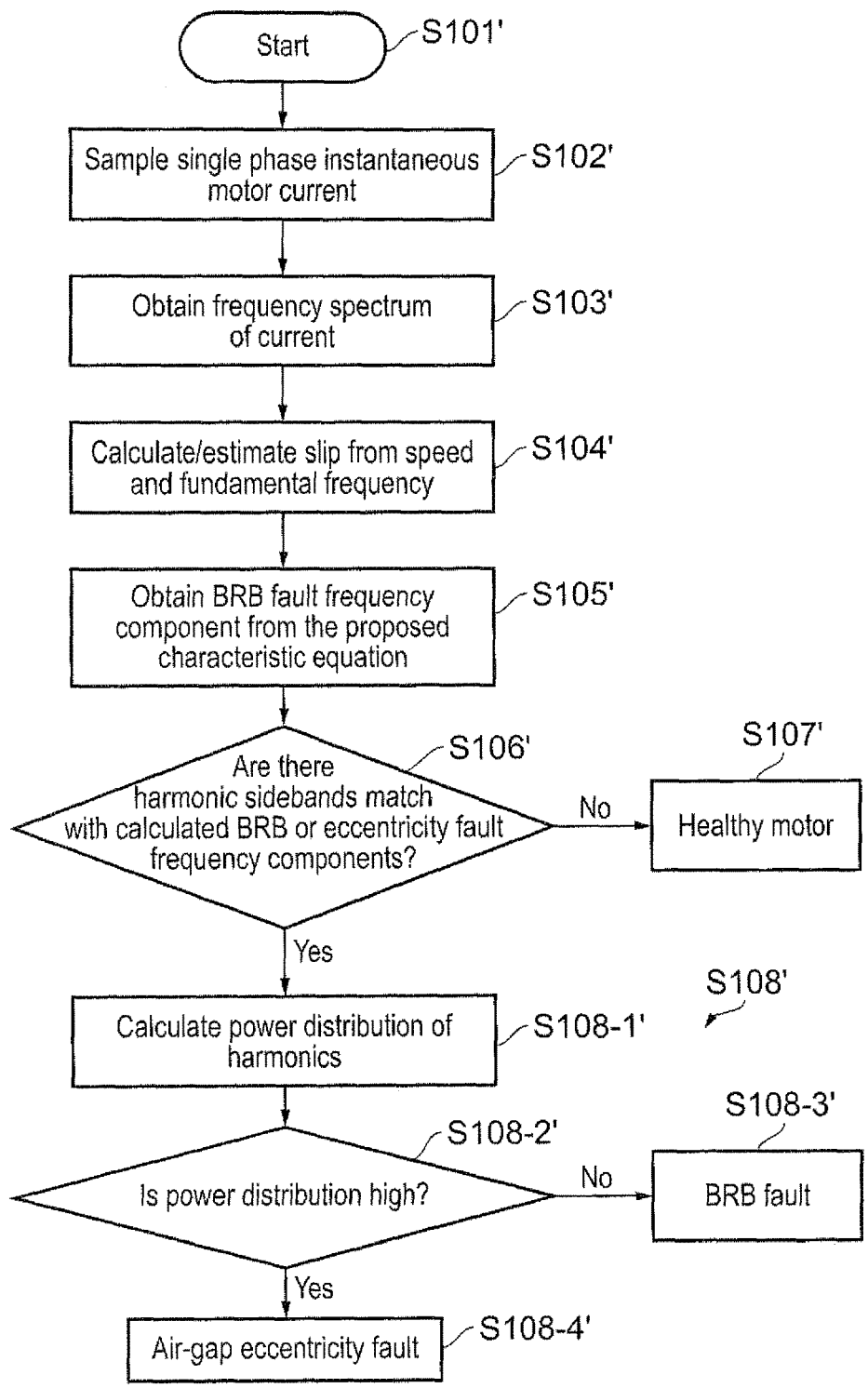
FIG. 14 shows another example process embodying aspects of the present invention and including an optional modification.

FIG. 14 shows an embodiment of the present invention, in which a method according to e.g. FIG. 7 is optionally modified to include the process of distinguishing between BRB faults and air gap eccentricity.

S101' to S107' shown in FIG. 14 are preferably performed similarly to that described above for FIG. 7.

However, for this embodiment, S108' includes the steps of determining whether any identified sidebands, e.g. fault frequencies, are likely to be BRB faults or are likely to be indicative of an air gap eccentricity fault.

Thus, at S108-1' the power distribution of one or more harmonics (preferably the harmonics other than the fundamental harmonic, i.e. other than harmonic at the fundamental line frequency) to their respective sideband(s) is calculated.

At S108-2' a judgement is made. The judgement made is whether or not the calculated power distribution is high or not. The power distribution may be considered to be high if it exceeds a predetermined threshold, for example. The predetermined threshold may be based on a power distribution calculated for the same (or another) induction machine known to be BRB and/or air gap eccentricity fault free. The predetermined threshold may alternatively be a user or engineer selected threshold value.

If the judgement at S108-2' is that the calculated power distribution is not high, then the judgement is that the sideband(s) identified at S106' is/are indicative of a BRB fault. Thus, the process proceeds to S108-3'

However, if the judgement at S108-2' is that the calculated power distribution is high, then the judgement is that the sideband(s) identified at S106' is/are indicative of an air-gap eccentricity fault. Thus, the process proceeds to S108-4'.

In any embodiment or aspect, when a judgement or determination is made that a fault has occurred, a warning may be generated that the induction machine is faulty. In any embodiment or aspect, when a judgement or determination is made that a fault has occurred, the induction machine may be tripped.

Figure 15:
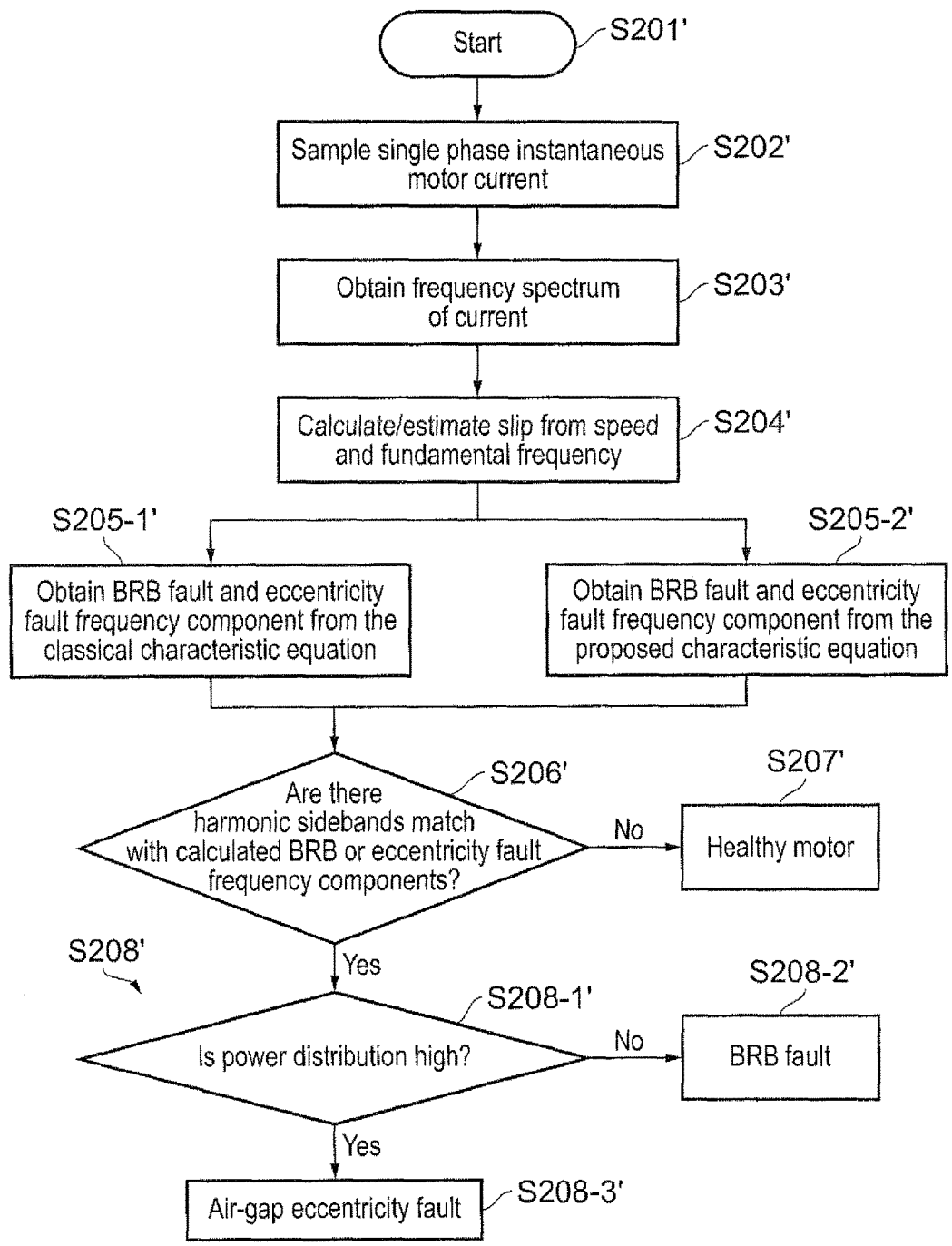
FIG. 15 shows another example process embodying aspects of the present invention and including an optional modification.

FIG. 15 shows another embodiment of the present invention, in which the example process shown in FIG. 8 is optionally modified to include a process similar to that described above for S108' in FIG. 14.

Hence steps S201' to S207' of FIG. 15 are preferably performed similarly to that described above for S201 to S207 of FIG. 8.

At S208-1' a judgement is made. The judgement made is whether or not the power distribution of one or more harmonics and their respective sidebands is high or not. The power distribution may be considered to be high if it exceeds a predetermined threshold, for example. The predetermined threshold may be based on a power distribution calculated for the same (or another) induction machine known to be BRB and/or air gap eccentricity fault free. The predetermined threshold may alternatively be a user or engineer selected threshold value.

The method preferably includes another step, preceding S208-1', in which the power distribution of one or more harmonics (preferably the harmonics other than the fundamental harmonic) to their respective sideband(s) is calculated. The judgement at S208-1' may be based on the result(s) of this calculation.

If the judgement at S208-1' is that the calculated power distribution is not high, then the judgement is that the sideband(s) identified at S206' is/are indicative of a BRB fault. Thus, the process proceeds to S208-2'.

However, if the judgement at S208-1' is that the calculated power distribution is high, then the judgement is that the sideband(s) identified at S206' is/are indicative of an air-gap eccentricity fault. Thus, the process proceeds to S208-3'.

Figure 16:
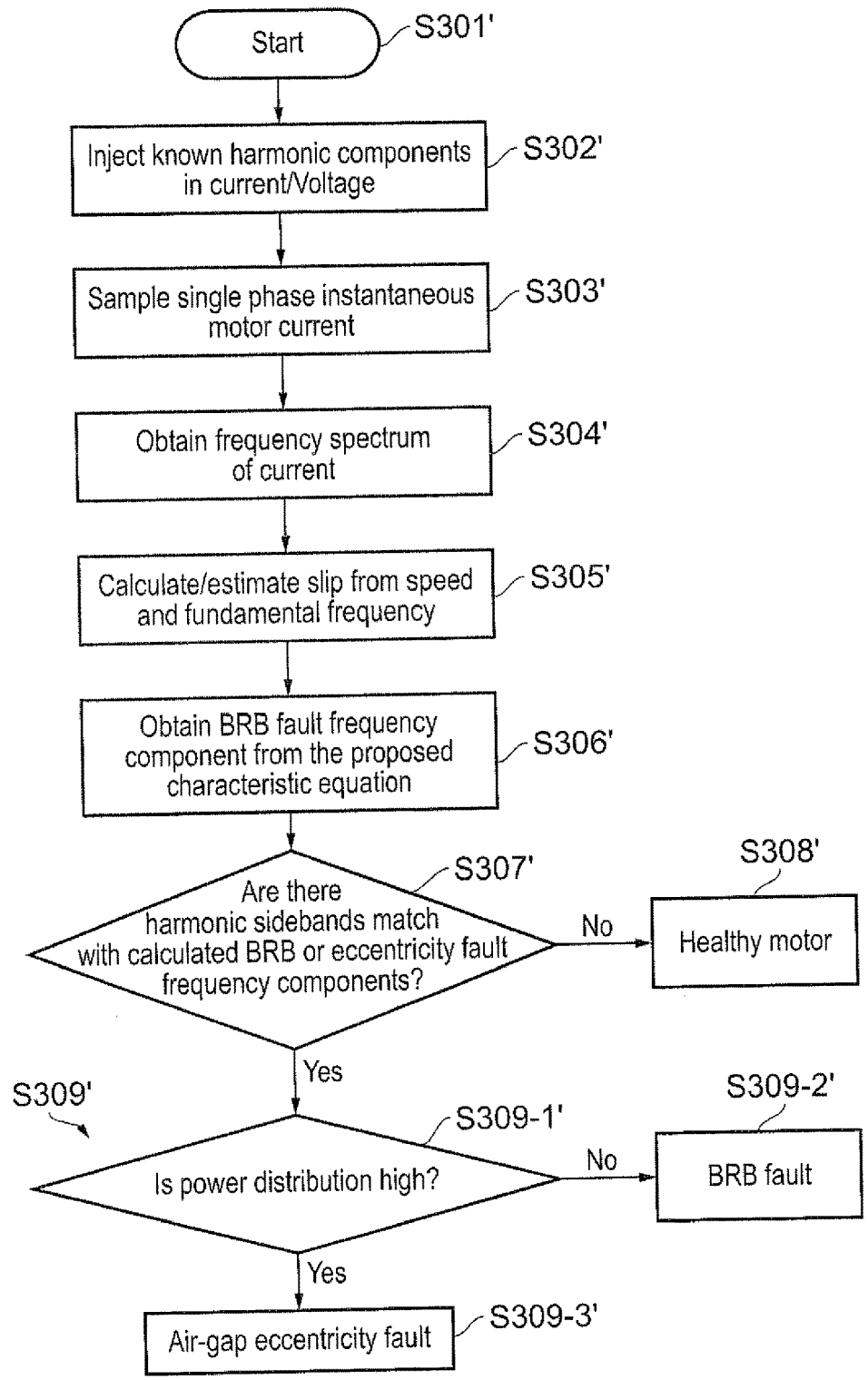
FIG. 16 shows another example process embodying aspects of the present invention and including an optional modification

FIG. 16 shows another embodiment of the present invention, in which the example process shown in FIG. 9 is optionally modified to include a process similar to that described above for S208' shown in FIG. 15.

Hence steps S301' to S307' of FIG. 16 are preferably performed similarly to that described above for S301 to S307 of FIG. 9.

At S309-1' a judgement is made. The judgement made is whether or not the power distribution of one or more harmonics and their respective sidebands is high or not. The power distribution may be considered to be high if it exceeds a predetermined threshold, for example. The predetermined threshold may be based on a power distribution calculated for the same (or another) induction machine known to be BRB and/or air gap eccentricity fault free. The predetermined threshold may alternatively be a user or engineer selected threshold value.

The method may include another step, preceding S309-1', in which the power distribution of one or more harmonics (preferably the harmonics other than the fundamental harmonic) to their respective sideband(s) is calculated. The judgement at S309-1' may be based on the result(s) of this calculation.

If the judgement at S309-1' is that the calculated power distribution is not high, then the judgement is that the sideband(s) identified at S307' is/are indicative of a BRB fault. Thus, the process proceeds to S309-2'.

However, if the judgement at S309-1' is that the calculated power distribution is high, then the judgement is that the sideband(s) identified at S307' is/are indicative of an air-gap eccentricity fault. Thus, the process proceeds to S309-3'.

Figure 10:
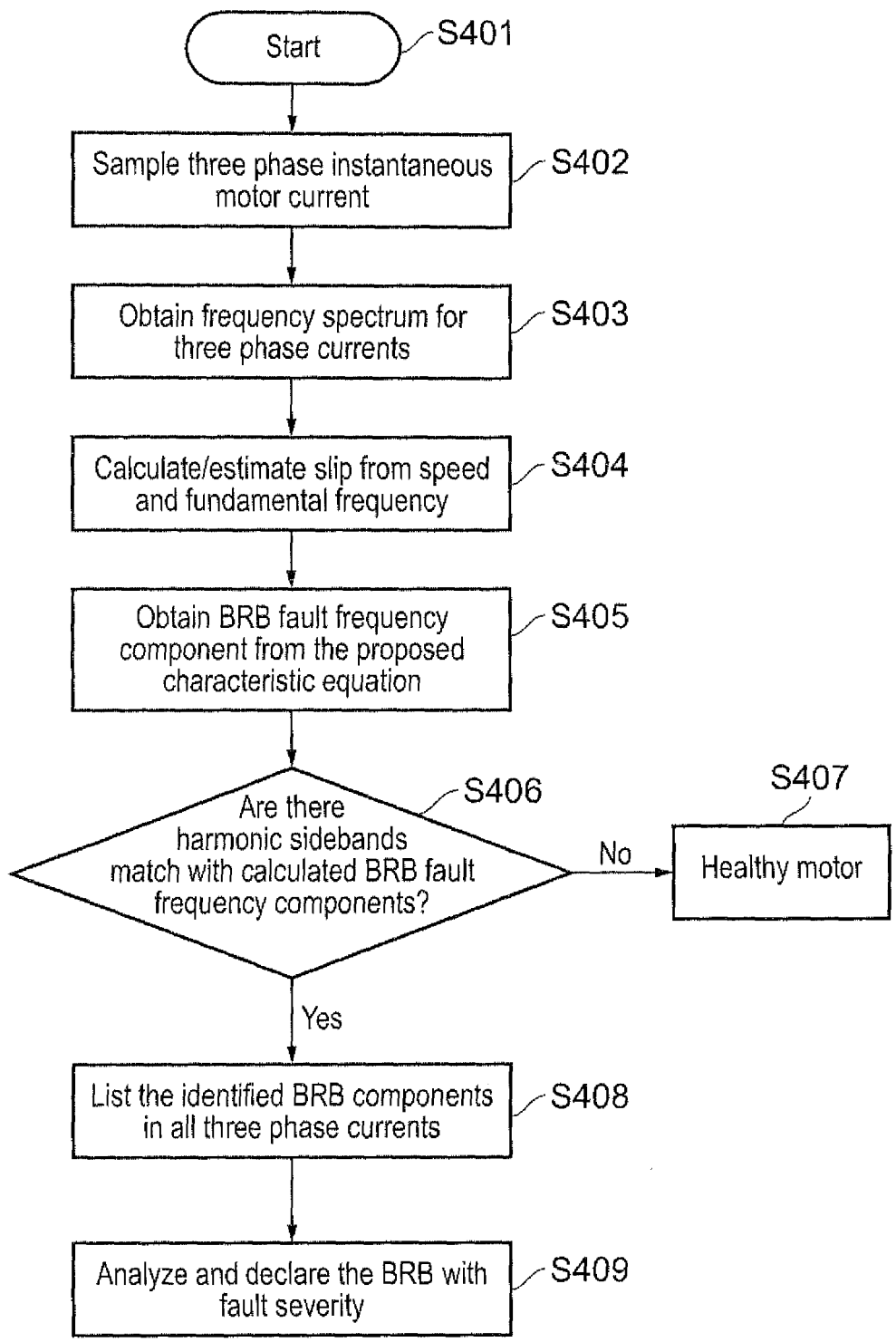
FIG. 10 shows a fourth example process embodying the present invention.
Figure 17:
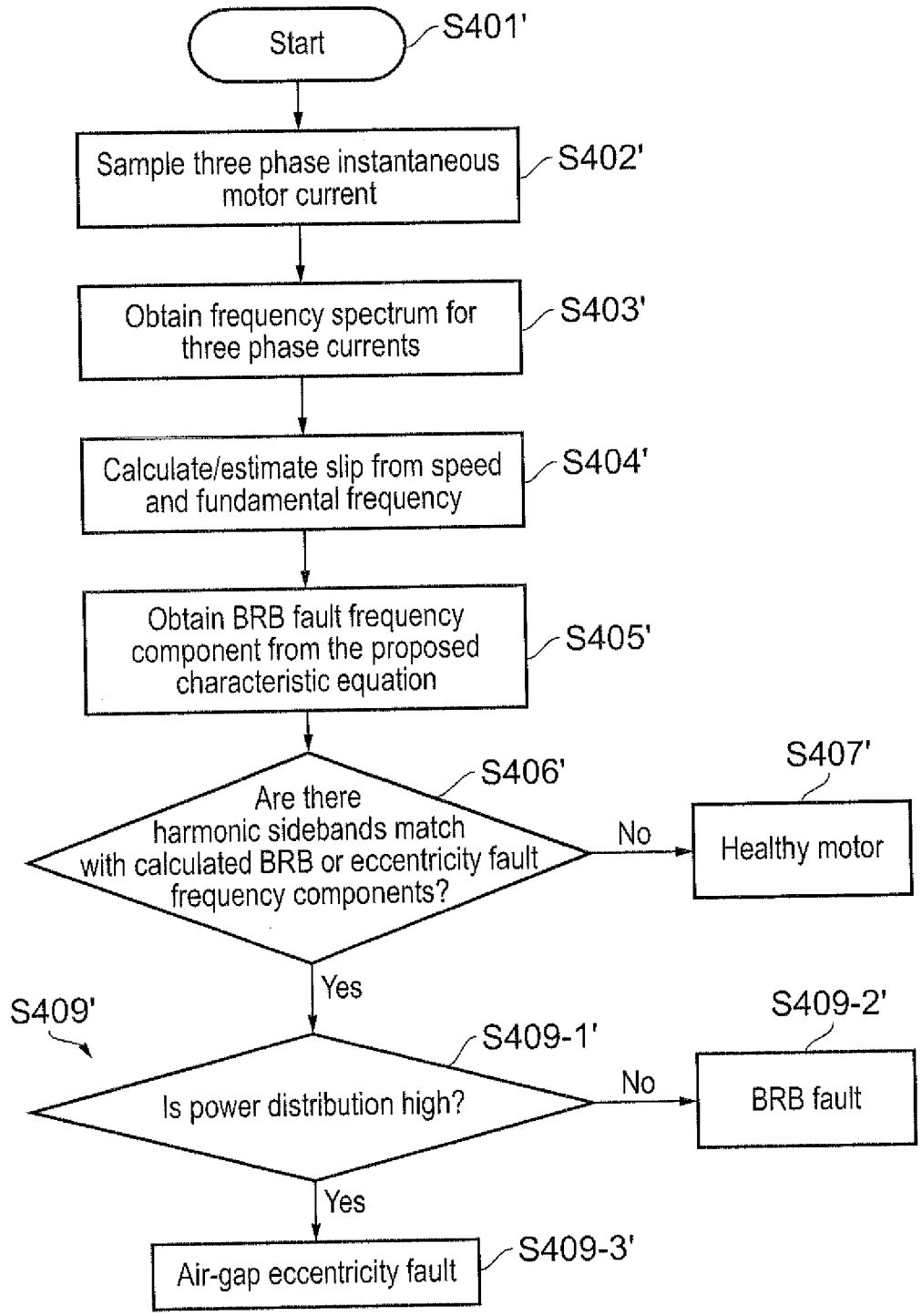
FIG. 17 shows another example process embodying aspects of the present invention and including an optional modification.

FIG. 17 shows another embodiment of the present invention, in which the example process shown in FIG. 10 is optionally modified to include a process similar to that described above for S208' shown in FIG. 15.

Hence steps S401' to S407' of FIG. 17 are preferably performed similarly to that described above for S401 to S407 of FIG. 10.

Although not shown in FIG. 17, the process according to this embodiment preferably includes a step S408' after S406' and before S409-1'; S408' is preferably equivalent to S408 described above for FIG. 10.

At S409-1' a judgement is made. The judgement made is whether or not the power distribution of one or more harmonics and their respective sidebands is high or not. The power distribution may be considered to be high if it exceeds a predetermined threshold, for example. The predetermined threshold may be based on a power distribution calculated for the same (or another) induction machine known to be BRB and/or air gap eccentricity fault free. The predetermined threshold may alternatively be a user or engineer selected threshold value.

The method may include another step, preceding S409-1', in which the power distribution of one or more harmonics (preferably the harmonics other than the fundamental harmonic, i.e. the fundamental line frequency) to their respective sideband(s) is calculated. The judgement at S409-1' may be based on the result(s) of this calculation.

If the judgement at S409-1' is that the calculated power distribution is not high, then the judgement is that the sideband(s) identified at S406' is/are indicative of a BRB fault. Thus, the process proceeds to S409-2'.

However, if the judgement at S409-1' is that the calculated power distribution is high, then the judgement is that the sideband(s) identified at S406' is/are indicative of an air-gap eccentricity fault. Thus, the process proceeds to S409-3'.

Figure 18:
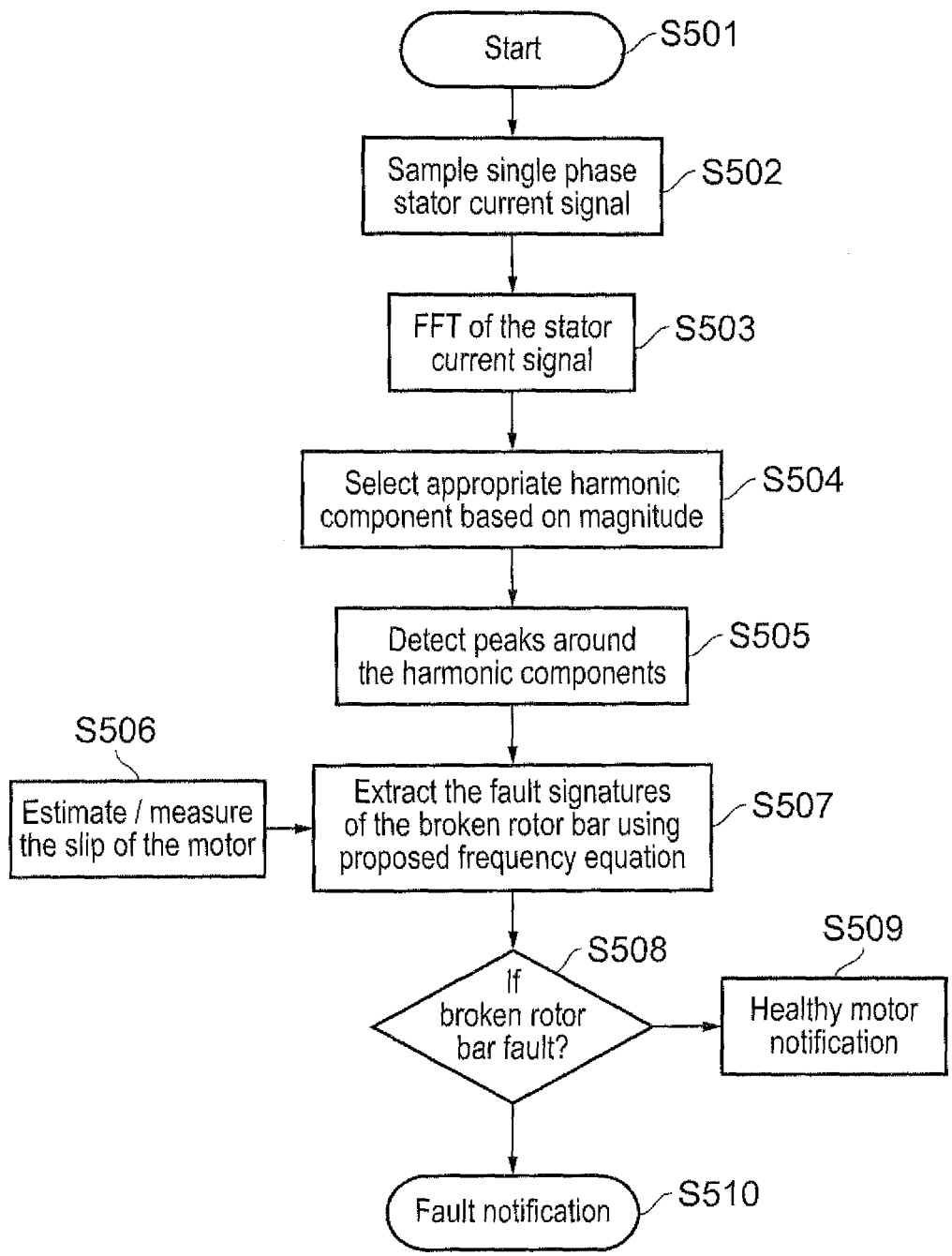
FIG. 18 shows another example process embodying aspects of the present invention.

FIG. 18 provides an explanation of another process in which the present invention can be used. In the explained process, the stator supply current is monitored to determine whether a broken rotor bar fault has occurred in a motor.

At S501 the process begins.

At S502 the proposed fault detection system (method) acquires the single phase current signal using a current sensor with appropriate sampling frequency.

At S503, a Fast Fourier Transform is applied to the stator current signal to transform the time domain signal to the frequency domain, and to acquire a frequency spectrum for the acquired single phase current.

According to the method a check is made for the fault signatures of broken rotor bar fault on the basis of values acquired from the equation proposed in this application. In order to make an accurate check, the slip of the motor is required. Thus, at S506, the slip can be estimated using principal slot harmonics, or it can be measured using a speed sensor.

At S504 and S505 appropriate harmonic component/components around which the sidebands need to be checked is selected. The harmonic component selection is based on its magnitude. One or more harmonic component(s) with a high magnitude value when compared with other harmonic components is/are selected.

A threshold of 1% is fixed and one or more (sidebands) peaks which are greater in amplitude than 1% of the selected harmonic component are selected.

The threshold value may be fixed based on the peak amplitudes for healthy motor sidebands, and the average noise distribution in the spectrum. Because of some asymmetries in the motor construction, there will always be some sidebands around the harmonic components, hence the sidebands which are greater than the magnitude of the existing sidebands in the healthy motor are considered for fault detection. Moreover, because spectral leakage (lobes due to insufficient data to FFT algorithm) there will be average noise in the frequency spectrum. Hence under this condition the threshold has to be fixed greater than the average noise in the frequency spectrum.

Once the peaks are extracted, it is compared with the frequency components calculated using proposed broken rotor bar equation at S507.

Any match in the detected (measured) peaks from the stator current frequency spectrum with the frequency components calculated according to the broken rotor bar equation proposed herein at S508 is notified as a broken rotor bar fault at S510.

If no match is found then the machine condition may be notified as healthy as S509.

Figure 19:
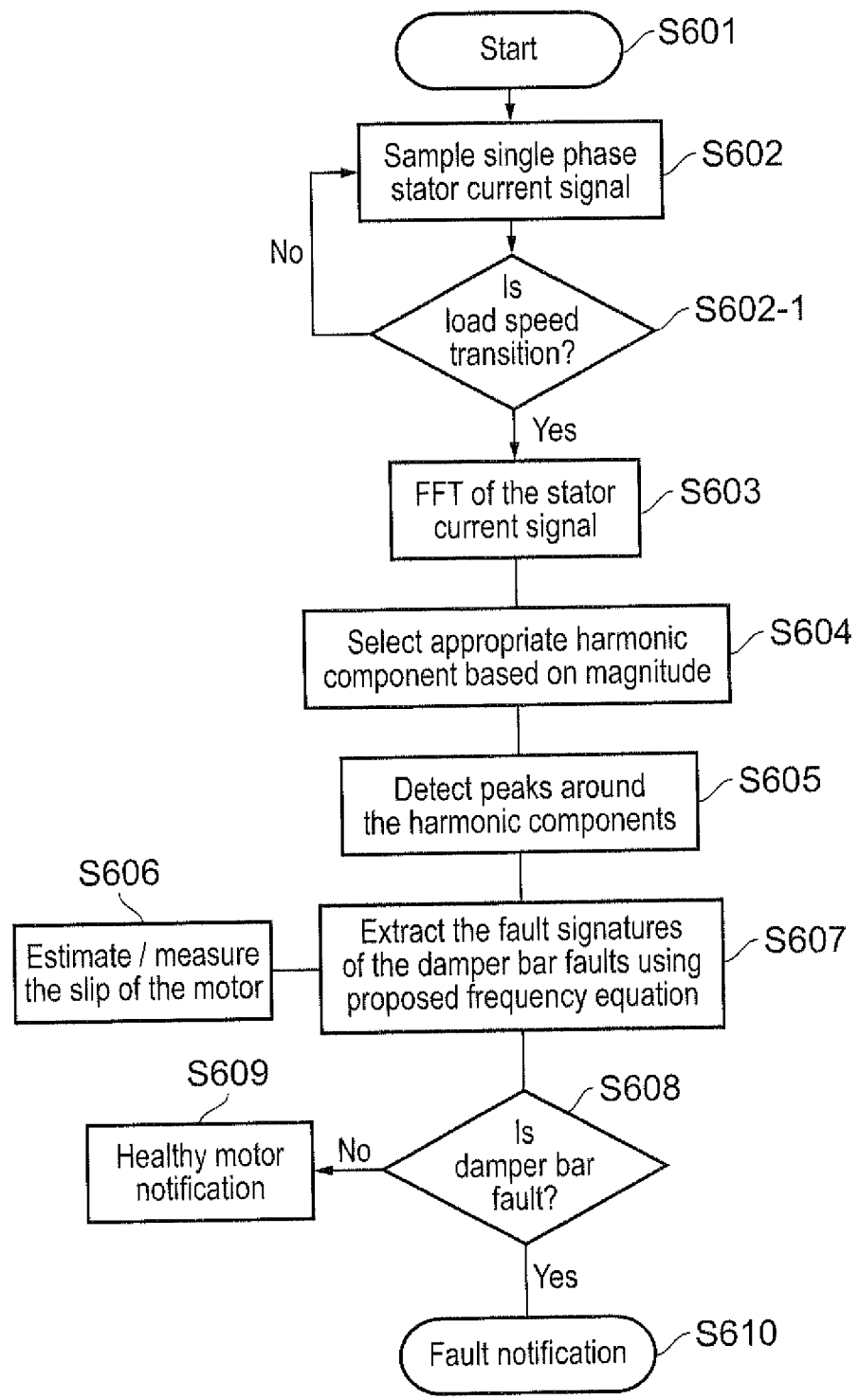
FIG. 19 shows another example process embodying aspects of the present invention.

FIG. 19 shows another example of use of the present invention. In this example, damper bar faults are identified rather than broken rotor bar faults. The damper bars may be provided in a synchronous generator, for example. Damper bars in a synchronous generator rotor carry current only during the transient state of the generator, e.g. when the rotational speed of the generator rotor is changed—for example at start-up of the generator. At steady state, i.e. when the rotation of the generator rotor is at steady state, the damper bar currents are zero. Thus, broken damper bars in a synchronous generator can be detected only during the transient state.

Hence, although the procedure to detect the broken damper bar fault is similar to the induction machine, the fault detection will execute only during the transient condition as will be understood with reference to FIG. 19.

So, S601 to S610 are performed similarly to S501 to S510; except, of course, that at S608, S609 and S610, a determination is made whether or not a damper bar fault has occurred rather than a broken rotor bar fault. However, at S602-1, an optional step is included in the method, in which it is determined whether or not the load on the generator or the speed of the generator rotor has transitioned, or is in transition. If the determination is negative, then the process of S603 to S610 is preferably not performed, as the current in the damper bar(s) will be zero, or at best negligible. However, if the determination is positive, then the process of S603 to S610 is preferably performed, for example generally according to the discussion for S503 to S510 above.

The new characteristic equation for fault detection, in particular BRB fault detection, can be used to analyze the sidebands in each phase current of a multiphase current induction machine (e.g. in all three phases of a three phase induction machine such as a motor). Fault detection and diagnosis processes can then be performed based on the cumulative effect of BRB on all three phase currents.

The present invention improves the reliability and availability of electrical induction machines, e.g. induction motors, by early, rapid and reliable detection of faults, e.g. BRB faults.

Advantageously, and unlike the existing approach, the new characteristic equation proposed herein allows the identification of the fault frequencies in the current harmonic sidebands, by providing information about both the +2s and −2s components. In short, the present inventors provide a new equation which facilitates the identification of both the lower and the upper sidebands around all the harmonics in the current drawn by an induction machine, e.g. a motor.

The present invention also provides the flexibility of selecting the harmonic order around which the sidebands can be observed.

The method(s) proposed herein is also useful in identifying the air gap eccentricity, by proposing the calculation of the power distribution of harmonics to its side bands to distinguish between BRB faults and air gap eccentricities.

The present invention may be embodied in software. For example, the present invention may be provided as a computer program, which when run by a computer, causes the computer to execute any method disclosed herein. The computer program may be provided as a computer program product. For example, the computer program may be provided on a computer readable medium, e.g. a storage medium.

It is to be noted that any feature of any embodiment, example or aspect, can be introduced into any other embodiment, example or aspect, where it is technically possible to do so, unless that introduction is explicitly said to be undesirable.

The present invention can also be used to detect broken damper bars in Brushless Synchronous Generator (BLSG). The damper bars in BLSG start the machine as an induction machine and are used to damp the oscillation of the rotor in the BLSG due to sudden load demand or load shedding. As BLSGs are widely used in aircrafts and marine vessels for onboard power generation it is important to detect the fault at early state.

The invention claimed is:

1. A method of detecting a fault in an induction machine having one or more windings, the method comprising:
   detecting a phase component of a driving current flowing in a stator of one or more windings of the induction machine at a supply frequency;
   generating a predetermined fault frequency based on a slip of the induction machine, the slip of the induction machine being based on a rotational speed of a rotor of the induction engine relative to a rotational speed of the stator in the induction machine and the supply frequency of the current flowing in the induction machine;
   determining whether a respective sideband of one or more selected harmonics of the supply frequency exists at the generated predetermined fault frequency in a signal in the one or more windings, each of the one or more selected harmonics of the supply frequency being a harmonic frequency higher than the supply frequency;
   determining that a fault has occurred in the one or more windings of the induction machine in response to determining that the existence of the respective sideband of one or more selected harmonics of the supply frequency is at the generated predetermined fault frequency;
   determining whether a power distribution of at least one of the one or more selected harmonics to the respective sidebands is below a predetermined threshold; and
   responsive to the power distribution being below the predetermined threshold, determining and identifying a fault type in the induction machine based on identifying fault frequency components of the selected harmonics of the supply frequency, other than the supply frequency itself; and
   in response to identifying the fault type in the induction machine, instructing a repair the induction machine based on the identified fault type determined using the fault frequency components of the selected harmonics of the supply frequency, such that the repair eliminates the determined fault, whereby the fault in the induction machine is determined and identified at a lower frequency resolution, a lower slip, and a lower fault severity allowing for earlier and more reliable detection of the fault to prevent permanent failure/damage of the induction machine.

2. The method of detecting a fault in an induction machine according to claim 1, further comprising assessing whether a magnitude of the respective sideband of the one or more selected harmonics exceeds the predetermined threshold, and determining that the fault has occurred if the assessment is positive.

3. The method of detecting a fault in an induction machine according to claim 1, further comprising modifying the signal to include the one or more selected harmonics as one or more probe harmonics.

4. The method of detecting a fault in an induction machine according to claim 3, further comprising determining whether a respective sideband of at least one of the one or more probe harmonics exists at the predetermined fault frequency in the signal in the one or more windings of the induction machine.

5. The method of detecting a fault in an induction machine according to claim 1, further comprising generating the predetermined fault frequency ($f_{brb}$) based on the following equation:

$$f_{brb}=(f_h \pm 2ksf_s), \text{ Where } k=1, 2, 3, \ldots$$

where, $f_s$ is the supply frequency, $f_h$ is a frequency corresponding to an $h^{th}$ order harmonic of the supply frequency, and s is the slip of the induction machine.

6. The method of detecting a fault in an induction machine according to claim 1, further including a step of acquiring a frequency spectrum of the signal.

7. The method of detecting a fault in an induction machine according to claim 6, further including a step of calculating the slip of the induction machine based on the acquired frequency spectrum.

8. The method of detecting a fault in an induction machine according to claim 1, wherein the induction machine includes a stator, the one or more windings being located on the stator.

9. The method of detecting a fault in an induction machine according to claim 1, wherein the induction machine is an induction motor, and the fault is in a rotor bar of the induction motor.

10. The method of detecting a fault in an induction machine according to claim 1, wherein the fault type is a broken rotor bar fault when the power distribution is below the predetermined threshold, and is an air gap eccentricity when the power distribution is above the predetermined threshold.

11. A fault detector for detecting a fault in an induction machine having one or more windings arranged to draw a current at a supply frequency, the fault detector comprising:
    a sensor acquiring a measurement of the signal in the one or more windings, and transmitting an output indicative of a frequency spectrum of the measured signal; and
    a processor arranged to receive the transmitted output, and arranged to perform the method according to claim 1.

12. The fault detector according to claim 11, further including a signal modifier arranged to modify the signal to include the one or more selected harmonics as one or more probe harmonics.

13. The fault detector according to claim 11, wherein the induction machine is an induction motor, and the fault is in a rotor bar of the induction motor.

14. The fault detector according to claim 11, wherein the one or more windings are arranged to draw the current at the supply frequency to drive rotation of a rotor.

15. The fault detector according to claim 11, wherein the signal is at least a component of the drawn current.

16. The method of detecting a fault in an induction machine according to claim 1, wherein the induction machine is a generator, and the fault is in a damper bar of the generator.

17. The fault detector according to claim 11, wherein the induction machine is a generator and the fault is a damper bar of the generator.

* * * * *